US011268522B2

(12) United States Patent
Aiello

(10) Patent No.: US 11,268,522 B2
(45) Date of Patent: Mar. 8, 2022

(54) ADHESIVE JOINT FEATURES

(71) Applicant: Apple Inc., Cupertino, CA (US)

(72) Inventor: Anthony Joseph Aiello, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 275 days.

(21) Appl. No.: 14/795,829

(22) Filed: Jul. 9, 2015

(65) Prior Publication Data

US 2016/0010649 A1 Jan. 14, 2016

Related U.S. Application Data

(60) Provisional application No. 62/022,600, filed on Jul. 9, 2014, provisional application No. 62/023,732, filed on Jul. 11, 2014.

(51) Int. Cl.
*F04D 25/06* (2006.01)
*H02K 3/52* (2006.01)
(Continued)

(52) U.S. Cl.
CPC .............. *F04D 17/08* (2013.01); *F04D 25/06* (2013.01); *F04D 25/0613* (2013.01);
(Continued)

(58) Field of Classification Search
USPC .... 417/352, 353, 363, 423.1, 423.7, 423.15, 417/423.12, 423.14; 360/99.08, 99.15;
(Continued)

(56) References Cited

U.S. PATENT DOCUMENTS 4,535,373 A * 8/1985 Schuh .................. G11B 17/038
360/133
4,825,114 A 4/1989 Ohtsuka
(Continued)

FOREIGN PATENT DOCUMENTS

CN 1367568 A 9/2002
CN 1897412 A 1/2007
(Continued)

OTHER PUBLICATIONS

"First Office Action", Chinese Application No. CN201510403904.3, dated Jun. 26, 2017, 29 pages.
(Continued)

*Primary Examiner* — Peter J Bertheaud
*Assistant Examiner* — Geoffrey S Lee
(74) *Attorney, Agent, or Firm* — Kilpatrick Townsend & Stockton LLP

(57) ABSTRACT

A fan assembly having a reduced dimension formed by several modifications is described. The fan assembly includes a stator having stator coils positioned within a recessed portion of a pillow that receives the motor. The stator may include wire connections positioned between adjacent stator coils and designed to terminate wires of the stator coils. The wire terminations may be on a protrusion or a post positioned between adjacent stator coils, or alternatively, the wire terminations may be disposed on protruding features of a bushing. The protrusion may be formed from an electrically conductive material and electrically connected to a motor control circuit via a flexible printed circuit. In some embodiments, the protrusion is part of an electrically neutral stator bushing having several pins. Also, a gap region between the bushing and a flange feature is designed to improve an adhesive joint.

13 Claims, 16 Drawing Sheets

(51) Int. Cl.
| | |
|---|---|
| *H01F 6/06* | (2006.01) |
| *H02K 3/46* | (2006.01) |
| *H02K 5/04* | (2006.01) |
| *H05K 7/20* | (2006.01) |
| *F04D 17/08* | (2006.01) |
| *F04D 29/64* | (2006.01) |
| *H02K 5/22* | (2006.01) |
| *H02K 15/00* | (2006.01) |
| *G06F 1/20* | (2006.01) |

(52) U.S. Cl.
CPC ........... *F04D 29/646* (2013.01); *G06F 1/203* (2013.01); *H01F 6/06* (2013.01); *H02K 3/46* (2013.01); *H02K 3/521* (2013.01); *H02K 5/04* (2013.01); *H02K 5/225* (2013.01); *H02K 15/0056* (2013.01); *H05K 7/20136* (2013.01); *H02K 2203/03* (2013.01)

(58) Field of Classification Search
USPC ....................................................... 403/473
See application file for complete search history.

(56) References Cited

U.S. PATENT DOCUMENTS

| | | | |
|---|---|---|---|
| 5,256,922 A | 10/1993 | Tanaka | |
| 5,424,887 A * | 6/1995 | Schuh | G11B 17/038 360/97.16 |
| 5,461,271 A * | 10/1995 | Asama | H02K 1/187 310/67 R |
| 5,481,144 A | 1/1996 | Dunfield | |
| 5,552,650 A * | 9/1996 | Cap | H02K 1/187 277/419 |
| 5,578,883 A * | 11/1996 | Sakashita | H02K 1/187 310/216.127 |
| 5,635,781 A | 6/1997 | Moritan | |
| 5,663,604 A | 9/1997 | Takahashi | |
| 5,996,685 A * | 12/1999 | Alizadeh | F04D 29/326 123/41.49 |
| 6,208,050 B1 * | 3/2001 | Fujii | F16C 25/08 310/51 |
| 6,282,053 B1 * | 8/2001 | MacLeod | G11B 19/2009 310/67 R |
| 6,316,855 B1 | 11/2001 | Moosmann et al. | |
| 6,407,882 B1 * | 6/2002 | Katahara | G11B 19/2009 310/51 |
| 6,445,535 B1 | 9/2002 | Rehm | |
| 6,915,557 B2 * | 7/2005 | Obata | G11B 19/2018 156/381 |
| 8,189,290 B2 * | 5/2012 | Sakata | G11B 19/2009 360/99.08 |
| 8,476,793 B2 * | 7/2013 | Aiello | H02K 1/185 310/67 R |
| 8,928,196 B2 * | 1/2015 | Smirnov | H02K 5/163 310/67 R |
| 9,140,268 B2 * | 9/2015 | Teshima | F04D 29/056 |
| 2002/0117909 A1 | 8/2002 | Gomyo | |
| 2002/0175575 A1 | 11/2002 | Nishikata | |
| 2004/0000828 A1 | 1/2004 | Kobayashi | |
| 2004/0007929 A1 * | 1/2004 | Wakita | H02K 5/1675 310/152 |
| 2004/0108827 A1 | 6/2004 | Kusaka | |
| 2004/0245878 A1 * | 12/2004 | Kim | D06F 37/304 310/114 |
| 2005/0140220 A1 | 6/2005 | Tsuda | |
| 2007/0228851 A1 * | 10/2007 | Smirnov | H02K 5/163 310/90 |
| 2007/0257574 A1 * | 11/2007 | Kim | H02K 5/163 310/90 |
| 2010/0310390 A1 * | 12/2010 | Huang | F04D 25/0613 417/352 |
| 2010/0328819 A1 | 12/2010 | Shinji | |
| 2011/0150677 A1 | 6/2011 | Ida | |
| 2011/0249362 A1 | 10/2011 | Saichi et al. | |
| 2012/0027571 A1 * | 2/2012 | Cho | F04D 29/023 415/119 |
| 2012/0153781 A1 * | 6/2012 | Yoo | G11B 19/2009 310/425 |
| 2013/0004348 A1 * | 1/2013 | Sugiyama | F16C 33/745 417/423.7 |
| 2014/0009040 A1 | 1/2014 | Song et al. | |
| 2014/0191605 A1 * | 7/2014 | Mauch | H02K 5/10 310/91 |
| 2015/0357874 A1 * | 12/2015 | Kim | G11B 19/2009 360/99.11 |
| 2017/0133915 A1 | 5/2017 | Yu | |

FOREIGN PATENT DOCUMENTS

| | | | | |
|---|---|---|---|---|
| CN | 101931300 | A | 12/2010 | |
| CN | 102104290 | A | 6/2011 | |
| CN | 102444596 | A | 5/2012 | |
| CN | 103532258 | A | 1/2014 | |
| JP | 63228937 | A | 9/1988 | |
| JP | 05038116 | A | 2/1993 | |
| JP | 06046543 | A | 2/1994 | |
| JP | 2009072007 | A | 4/2009 | |
| JP | 2010275958 | A | 12/2010 | |
| KR | 20110132734 | A | 12/2011 | |
| KR | 101113531 | | 2/2012 | |
| TW | 202012012441 | U1 * | 1/2013 | ............... H02K 5/10 |
| WO | WO 02061294 | A1 | 8/2002 | |

OTHER PUBLICATIONS

Chinese Patent for Utility Model No. ZL201520494953.8—Utility Model Patentability Evaluation Report (UMPER) dated Mar. 1, 2016.
Second Office Action (English Translation) dated Nov. 16, 2017 in Chinese Patent Application No. 201510403904.3, 9 pages.
Final Office Action dated Mar. 9, 2018 in U.S. Appl. No. 14/795,822, 23 pages.
Office Action dated Aug. 28, 2017 in U.S. Appl. No. 14/795,822, 24 pages.
Office Action dated Sep. 28, 2017 in U.S. Appl. No. 15/667,128, 24 pages.
Office Action dated Aug. 3, 2018 in U.S. Appl. No. 14/795,822, 22 pages.
Final Office Action dated Apr. 19, 2019 in U.S. Appl. No. 14/795,822. 26 pages.

* cited by examiner

ADHESIVE JOINT FEATURES

CROSS-REFERENCE TO RELATED APPLICATION(S)

This application claims the benefit of priority under 35 U.S.C. § 119(e) to U.S. Provisional Application No. 62/022,600, filed on Jul. 9, 2014, and titled "MOTOR INTERCONNECT DEVICE," and to U.S. Provisional Application No. 62/023,732, filed on Jul. 11, 2014, and titled "MOTOR INTERCONNECT DEVICE," the disclosures of which are incorporated herein by reference in its entirety.

FIELD

The described embodiments relate generally to a component within an electronic device. In particular, the present embodiments relate to an electronic device having a motor with a reduced height which may allow for reduced dimensions of the electronic device.

BACKGROUND

Centrifugal fans are commonly used in computing systems and other electronic devices to provide cooling of the central processing unit (CPU), graphics processing unit (GPU) and/or other modules. Newer product generations typically introduce new features and/or faster processors that offer improved computing performance. Additionally, in the area of portable electronic devices, reduction in the overall thickness of the computer, particularly the enclosure, is a common goal for improving portability and customer appeal. In order to compensate for a smaller enclosure, a cooling fan may include a fan having a reduced motor height, which can compromise the motor performance.

However, as a result of these upgrades, higher thermal loading may be imposed on the system, which consequently requires increased airflow from the cooling fan to avoid overheating or throttling of processor performance to stay within sustainable temperature ranges. Also, as enclosures of portable electronic devices continue to have reduced dimensions, airflow through enclosures becomes highly impeded, resulting in increased demands on the cooling fan while at the same time requiring that the fan conform to the dimensions of the enclosure. Unfortunately, a cooling fan with a motor of reduced height corresponds to a fan having less torque delivery. Also, simply reducing the size of traditional cooling fans compromises the space needed to accommodate an electrical connection means for the fan motor.

Further, as enclosures of the computing systems become thinner, the space allocated for the motor and bearing is reduced, resulting in less space for mechanical attachment means. Any compromise on the impeller attachment to the pillow or base of the fan can result in reduced shock robustness, which is also a critical requirement of portable computing systems.

SUMMARY

In one aspect, a fan assembly is described. The fan assembly may include a bushing that includes a channel. The fan assembly may further include a pillow having a flange feature extending into the channel. In some embodiments, the flange feature includes a first axial surface separated from a first surface of the channel by a first gap distance and a second axial surface separated from a second surface of the channel by a second gap distance different from the first gap distance. Also, the second surface may be different from the first surface.

In another aspect, a fan assembly having a longitudinal axis that extends through a center of the fan assembly is described. The fan assembly may include a pillow comprising a pillow interface surface. The fan assembly may further include a bushing that extends circumferentially around the longitudinal axis and having a bushing interface surface that cooperates with the pillow interface surface defining an interface channel comprising an axial channel component that is parallel to the longitudinal axis. In some embodiments, the interface channel includes an axial channel component having a width, or thickness, that varies in accordance with a radial distance from the longitudinal axis.

In another aspect, a fan assembly suitable for use in a portable computing system is described. The fan assembly may include a pillow including a flange portion. The fan assembly may further include a cover secured with the pillow. The cover may include a channel that receives the flange portion. The fan assembly may further include an adhesive disposed in the channel to adhesively secure the cover with the pillow. In some embodiments, the adhesive includes a graduated thickness.

In another aspect, a fan assembly suitable for use in a portable computing system is described. The fan assembly may include a first part including a flange portion. The fan assembly may further include a second part secured with the first part. The second part may include a channel that receives the flange portion. The fan assembly may further include a first clearance formed by a gap between an inner surface to the flange portion and the surface facing the channel and a second clearance formed by the gap between the outer surface of the flange portion and another facing surface of the channel. The first clearance and the second clearance may run parallel to each other. The fan assembly may further an adhesive disposed in both the first clearance and the second clearance and disposed to adhesively secure the second part with the first part.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

Figure 1:
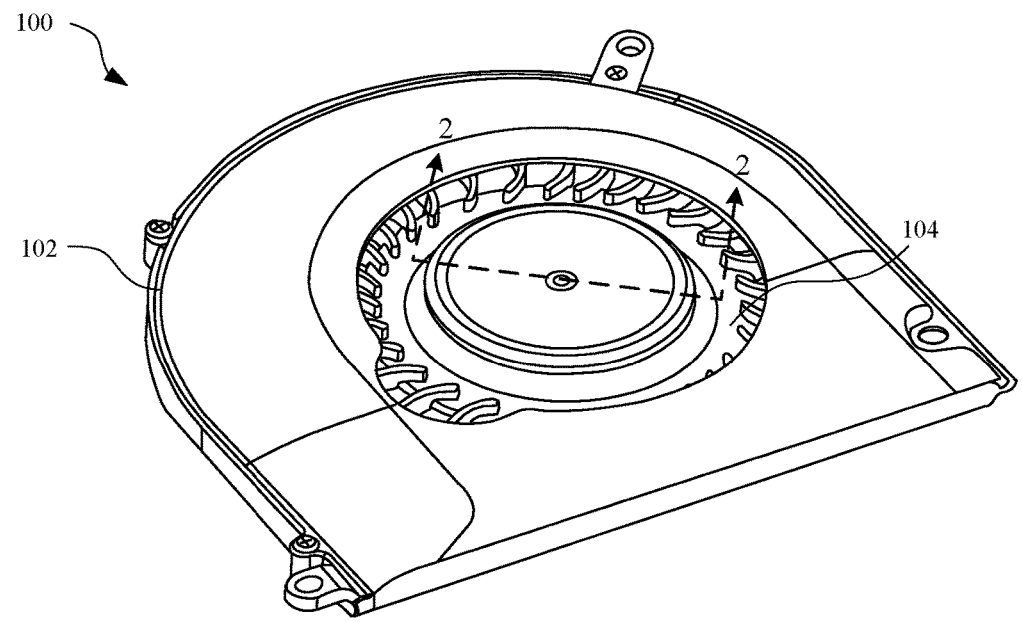
FIG. 1 illustrates an isometric view of a fan assembly.
Figure 2:
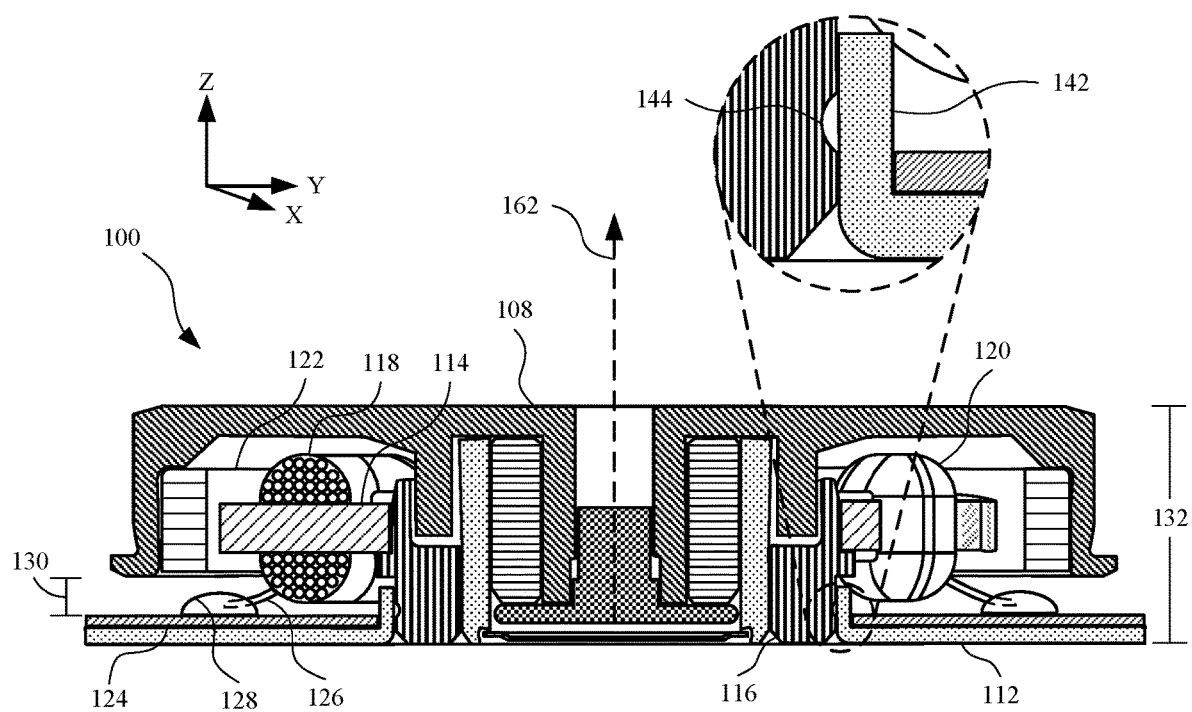
FIG. 2 illustrates a partial cross sectional view of the fan assembly in FIG. 1, taken along line 2-2.

FIG. 1 illustrates an isometric view of a fan assembly 100 that may be disposed within an electronic device, such as a laptop computing device. The fan assembly 100 can include a cover 102 that conceals a portion of an impeller 104. FIG. 2 illustrates a partial cross sectional view of the fan assembly 100 shown in FIG. 1, taken along the line 2-2. As shown, the fan assembly 100 includes various structural components, which may limit the ability to reduce its overall size, and in turn, limits the ability to reduce a size or dimension of an electronic device that includes the fan assembly 100. For example, the motor hub 108 and the printed circuit 124 are separated by a clearance region defined by a distance 130 shown in a z-direction. The distance 130 is due in part to the dimension of a first stator coil 118 and a second stator coil 120, both of which are attached to a stator 114. Also, each of the stator coils includes a wire portion that terminates in a location between the motor hub 108 (along with a portion of a magnet 122) and the printed circuit 124. For example, the wire portion 126 of the first stator coil 118 is terminated, via solder 128, between the motor hub 108 and the printed circuit 124. The presence of the solder 128 between the motor hub 108 and the printed circuit 124 may limit how close the motor hub 108 and the printed circuit 124, which may affect the overall height 132 of the fan assembly.

In addition, the fan assembly 100 is secured to a pillow 112 (or base). This is achieved by adhesively securing an outer surface of the bushing 116 to an inner surface of a flange feature 142 of the pillow 112. As shown in FIG. 1, 1) the bushing 116 extends circumferentially around a longitudinal axis 162 extending through the center of rotation of the fan assembly 100, and 2) the flange feature 142 extends circumferentially around the bushing 116. In order to center an impeller (not shown) used with the fan assembly 100, the inner surface of the flange feature 142 registers against the outer surface of the bushing 116. The function of centering the fan assembly 100 requires a small radial gap and a bond line thickness of the adhesive filling this radial gap may not be optimal for maximizing the joint strength. Adhesives used for these types of joints typically have peak strength when the bond line is approximately 0.05-0.1 millimeters (mm) thick. For this reason, the bushing 116 includes a circumferential groove 144 (shown in the enlarged view) in which the radial gap is closer to the optimal bond line thickness for whatever adhesive is chosen. This results in an even smaller "effective" axial length (in the direction of the longitudinal axis 162) of the adhesive joint, resulting is greatly diminished joint strength.

In the present disclosure, the described embodiments allow for reducing a dimension of a fan assembly while maintaining the integrity (e.g., torque delivery) of the fan assembly. In particular, a thickness, or z-height, of the fan assembly may be reduced in order to form a more compact form factor. Although reducing the dimension of the fan assembly reduces space for components, the components in the present disclosure are redesigned. For example, a fan assembly may use space between coils, which is traditionally unused space, in order to electrically connect coil lead wires to another component. Traditional connection of lead wires of a stator coil may be performed below a component (e.g., magnet) of the fan assembly using an operation such as soldering. However, in the present disclosure the lead wires are connected in different locations such that a motor hub may be repositioned, i.e., lowered, to a location previously occupied by traditional connection means of the lead wires. Also, because the connection is performed in the previously unused space, little, if any, modification or retrofitting of other components is required.

Also, in some embodiments, a pillow (or substrate) positioned below the fan assembly may include one or more recessed portions that receives the stator coils. In some embodiments, the pillow is formed from an injection molding operation in which the recessed portions are formed during formation of the pillow. In other embodiments, the recessed portions formed subsequent to formation of the pillow. In this manner, the recessed portions may be formed by a material removal operation. In either event, the recessed portions of the pillow may define an annular (or ring) shape. Alternatively, the recessed portions may define several individual recessed portions of the pillow, with the number of recessed portions corresponding to the number of stator coils. Also, the recessed portions may include a size and a shape to receive a portion of the stator coils.

Further, the present disclosure describes adhesive joints which may compensate for fan motor assemblies having a reduced size which in turn includes reduced surface area to form the adhesive joint. In this regard, a bushing of the fan assembly may be modified to receive a flange feature of the pillow. Further, the gap region defined by a space between the bushing and the flange region may include varying gap distances. For example, the gap region may include a first gap distance and a second gap distance greater than the first gap distance. In this manner, the strength of the adhesive joint formed in the gap region may be substantially increased, and the fan assembly is more resistant to load bearing events even in instances when the electronic device (that includes the fan assembly) includes a reduced size.

These and other embodiments discussed below with reference to FIGS. 3-19 illustrate a motor having a reduced dimension but without reduced performance (e.g., reduced torque delivery). However, those skilled in the art will readily appreciate that the detailed description given herein with respect to these Figures is for explanatory purposes only and should not be construed as limiting.

Figure 3:
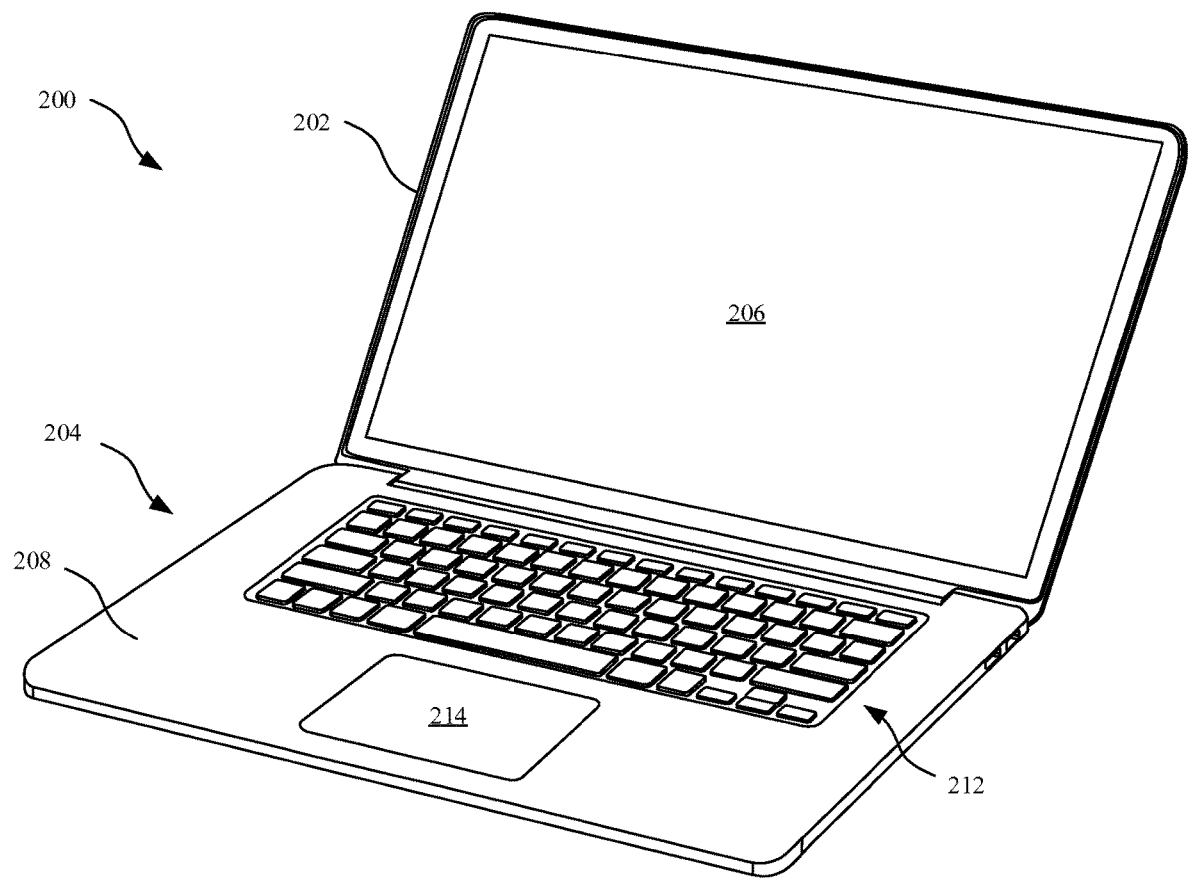
FIG. 3 illustrates an isometric view of an embodiment of an electronic device in an open configuration.

FIG. 3 illustrates an isometric view of an electronic device 200 in an open configuration. In some embodiments, the electronic device 200 is a portable electronic device such as a MACBOOK PRO®, made by Apple, Inc., from Cupertino, Calif. In other embodiments, the electronic device 200 is a different consumer electronic device designed to offer and/or display various visual content. As shown, the electronic device 200 includes a lid portion 202 pivotally connected to a base portion 204, both of which may be formed from a metal, such as aluminum or aluminum alloy. As shown, the lid portion 202 includes a display 206 designed to display visual content such as a graphical user interface, still images such as photos, as well as video media items such as movies. The display 206 may be electrically connected with one or more processors (not shown) in the base portion 204.

The base portion 204 may include a top case 208. As illustrated in FIG. 3, the top case 208 is designed to accommodate various user input devices such as a keyboard 212 and a touchpad 214. In particular, these user input devices may be exposed such that a user may interact with the input devices when the electronic device 200 is positioned in the open configuration. Further, the base portion 204 may include a bottom case (not shown). The bottom case along with top case 208 may cooperate to receive various other electronic and mechanical components.

Although not shown, the electronic device 200 may include several electronic components such as a mass storage device (e.g., a hard drive or a solid state storage device such as a flash memory device including non-transitory and tangible memory that may be, for example, volatile and/or non-volatile memory) configured to store information, data, files, applications, instructions or the like, a processor (e.g., a microprocessor or controller) configured to control the overall operation of the portable electronic device, a communication interface configured for transmitting and receiving data through, for example, a wired or wireless network such as a local area network (LAN), a metropolitan area network (MAN), and/or a wide area network (WAN), for example, the Internet, a fan, a heat pipe, and one or more batteries.

Figure 4:
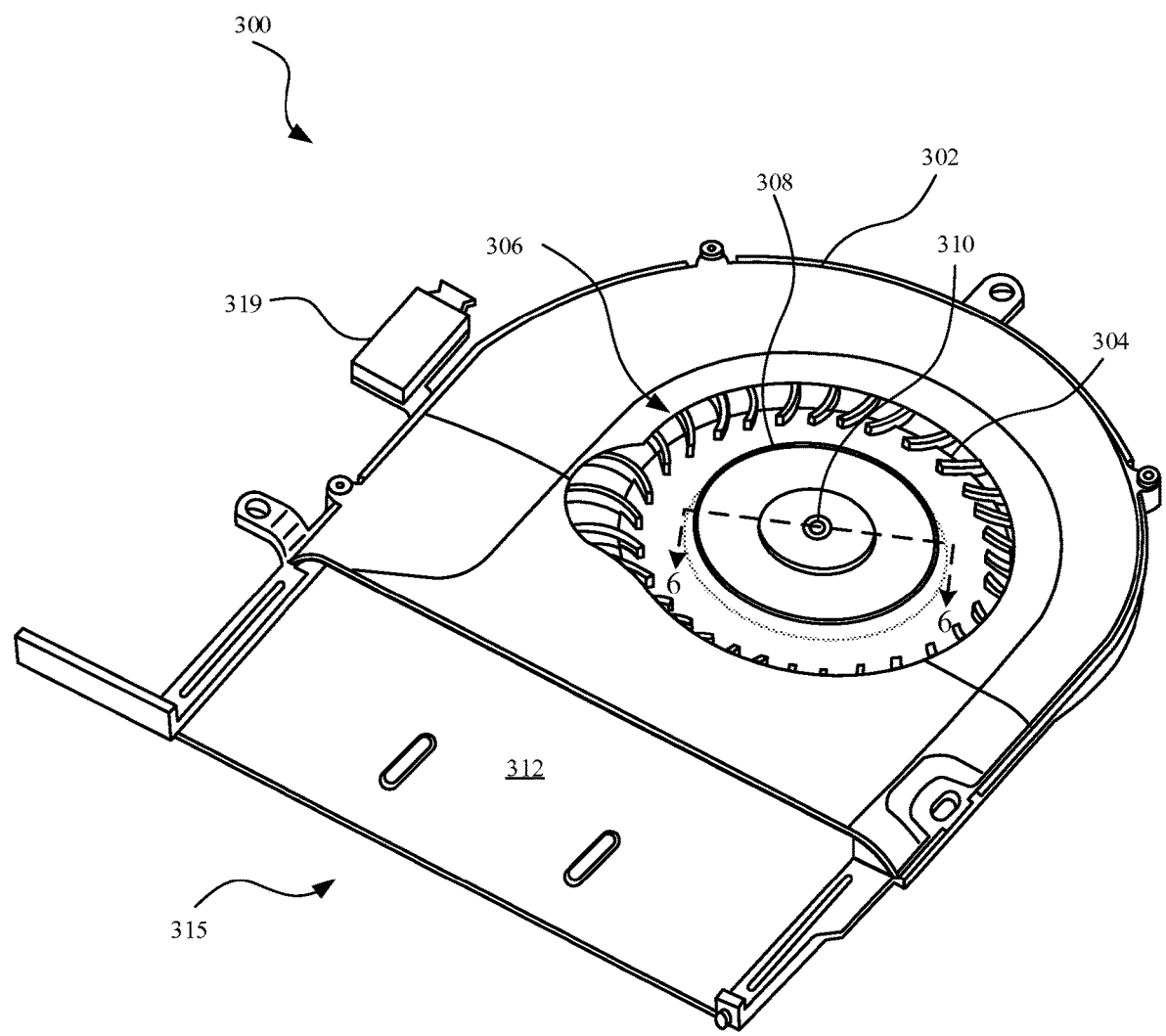
FIG. 4 illustrates an isometric view of a fan assembly in accordance with the described embodiments.

FIG. 4 illustrates an isometric view of a fan assembly 300 in accordance with the described embodiments. In some embodiments, the fan assembly 300 is a centrifugal fan designed to cool several components within an electronic device (such as the electronic device 200 shown in FIG. 3). The fan assembly 300 may include a cover 302 that covers a portion of the impeller 304. The cover 302 may include an opening 306 defining an inlet region for air to flow through the impeller 304. The fan assembly 300 may further include a motor hub 308, a bearing 310, and a motor (not shown) below the motor hub 308. In some embodiments, the motor is a 3-phase brushless DC motor.

The fan assembly 300 may further include a pillow 312 designed to receive and hold one or more components of the fan assembly 300. In some embodiments, the fan assembly 300 is positioned within a portion of an electronic device such that the pillow 312 is positioned against an interior portion of a top case (such as the top case 208 shown in FIG. 3) to form an integrated system. In some embodiments, the impeller 304 is designed to drive air received from the opening 306 to heat-dissipating components in order to cool those components. In other embodiments, the impeller 304 receives heated air from the heat-generating components within an electronic device via the opening 306, and drive the heated air along the pillow 312 and/or in a direction toward the outlet region 315 thereby allowing the heated air to escape the electronic device.

Also, in some embodiments, the fan assembly 300 includes a motor control circuit 319 electrically connected with the motor. The motor control circuit 319 may be configured to drive (or commutate) electrical current through the stator coils (not shown) of the motor in order to generate torque used to drive the impeller 304. In some embodiments, the motor control circuit 319 is positioned within the cover 302 or the motor hub 308. In the embodiment shown in FIG. 4, the motor control circuit 319 is external with respect to several components of the fan assembly 300, such as the cover 302, the impeller 304, and the motor hub 308. Also, the motor control circuit 319 may also be external with respect to the pillow 312. Also, in some embodiments, the motor control circuit 319 is electrically connected with an input/output (I/O) board (not shown), which may include a main logic board (MLB). In this manner, when the motor control circuit 319 is external to other components of the fan assembly 300, the fan assembly 300 may include a lower profile (e.g., less thickness in at least one dimension) without reduced performance. This will be discussed below. Also, although not shown, the motor control circuit 319 may be electrically connected with a flexible printed circuit, which may be at least partially within the cover 302.

Figure 5:
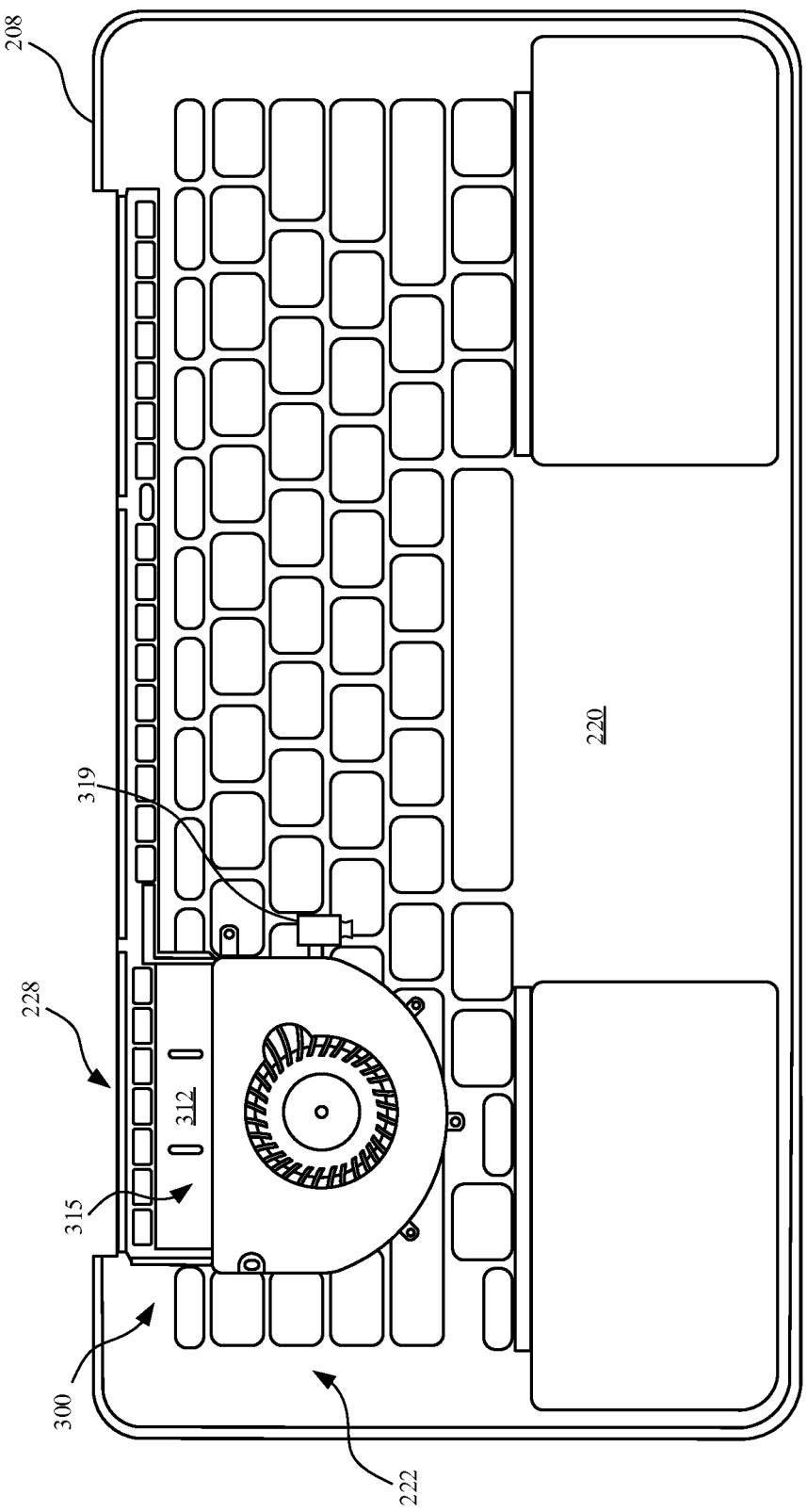
FIG. 5 illustrates a plan view of an internal portion of a top case of an electronic device having a fan assembly positioned within the internal portion, in accordance with the described embodiments.

FIG. 5 illustrates a plan view of an internal portion 220 of the top case 208 (shown in FIG. 3) having a fan assembly 300 (shown in FIG. 4) positioned within the internal portion 220. In this configuration, the pillow 312 is positioned proximate to a keyboard region 222 of the top case 208.

However, it should be appreciated that the fan assembly 300 may be positioned at any suitable location within an electronic device. Also, the pillow 312 and the outlet region 315 may be positioned proximate to openings 228 of top case 208 in order to facilitate the removal of air (such as heated air) from the electronic device.

Figure 6:
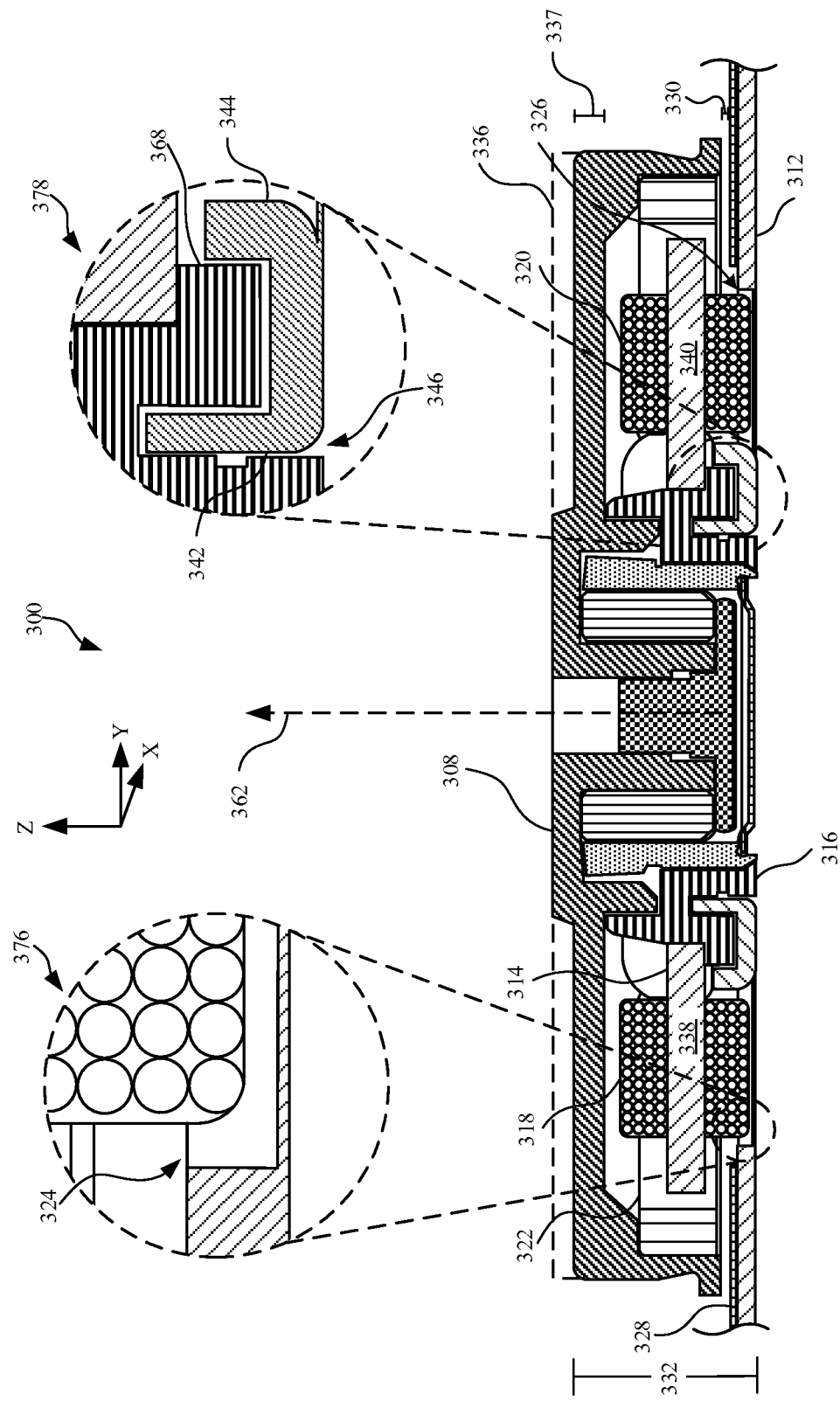
FIG. 6 illustrates a partial cross sectional view of a fan assembly shown in FIG. 4 taken along line 6-6, in accordance with the described embodiments.

In addition to locating the motor control circuit 319 externally with respect to the fan assembly 300, other additional configurations may contribute to the fan assembly having a lower profile. For example, FIG. 6 illustrates a partial cross sectional view of a fan assembly 300 taken along the 6-6 line in FIG. 4, in accordance with the described embodiments. In this embodiment, the fan assembly 300 may include a height 332 in the z-direction less than a height of fan motor assemblies previously discussed (such as a height 132 of the fan assembly 100) to define a lower profile of the fan assembly 300. This may be due in part to the fan assembly 300 including features that may facilitate reduction in the overall height of the fan assembly. For example, the fan assembly 300 may include a stator 314 positioned around a bushing 316. In some embodiments, the stator 314 is formed from several silicon steel sheets laminated together. The stator 314 may include several stator coils, such as first stator coil 318 and second stator coil 320, positioned on several stator poles of the stator 314. For example, the stator in FIG. 6 includes a first stator coil 318 and a second stator coil 320, each of which include electrically conducting coils wound around a first stator pole 338 and a second stator pole 340, respectively. For purposes of clarity, the wire portions interconnecting the stator coils are not shown. The first stator coil 318 and the second stator coil 320 are designed to receive electrical current from a power source (such as a battery disposed within an electronic device) to form an electromagnet.

The fan assembly 300 further includes a magnet 322 surrounding the stator coils. The magnet 322 is a multi-polarity magnet that includes a first polarity and a second polarity opposite the first polarity. The first polarity and the second polarity may be associated with a "North" facing polarity and a "South" facing polarity, respectively, also referred to as a "north" pole and "south" pole of a magnet. Although not shown, the magnet 322 may include several pairs that include a "north-south" configuration. For example, the magnet 322 may include a four-pole design having two north facing poles and two south facing poles. Generally, the magnet 322 may include any even number of poles in which a north pole is paired with a south pole. Also, the magnet 322 may be positioned around an inner circumference of the motor hub 308, as shown in FIG. 6. When electrical current passes through the stator coils, the magnet 322, the motor hub 308, and an impeller (not shown) coupled with the motor hub 308 may be actuated, or rotated, in order to drive air in a manner previously described. Also, traditional motors may include a wire connection (not shown) using solder to connect the wires of the coils in a location, for example, directly between a magnet (and/or a motor hub) and a circuit, as shown in FIG. 2. Accordingly, this location is occupied by both a wire as well as solder, both of which reduce the ability to minimize the height of a fan assembly. However, by locating this connection elsewhere within the fan assembly 300 (which will be discussed below), a distance 330 (or clearance) between the motor hub and a printed circuit assembly 328 is reduced and in turn a height 332 of the fan assembly 300 is also reduced, as shown in FIG. 6. It will be appreciated that in some embodiments, the printed circuit assembly 328 is a flexible printed circuit. However, the printed circuit assembly 328 may be a flexible material generally known in the art for electrically connecting two or more components.

Further, the pillow 312 includes a region of removed material to define one or more recessed portions, such as a first recessed portion 324 and a second recessed portion 326. The recessed portions are designed to at least partially receive the stator coils. For example, as shown, first recessed portion 324 and a second recessed portion 326 receive the first stator coil 318 and second stator coil 320, respectively. A first enlarged view 376 shows part of first recessed portion 324. In some embodiments, the recessed portions include a series of openings configured to receive the stator coils. The holes may be referred to as blind holes, or counter bores. The number of recessed portions generally corresponds to the number of stator coils on the stator 314. However, in other embodiments, one or more recessed portions may be designed to at least partially receive two or more stator coils.

In addition to or as an alternative to the recessed portions of the pillow 312, the fan assembly 300 may include additional features to achieve an overall lower profile. For example, fan motor assemblies include stator coils electrically connected to a printed circuit via a solder/wire connection located directly between a printed circuit and a magnet, or directly between a printed circuit and a motor hub. In the embodiment shown in FIG. 6, an electrical connection (not shown) between a stator coil and the printed circuit assembly 328 is in a location other than a location between the magnet 322 and the printed circuit assembly 328. In this manner, the motor hub 308 and the magnet 322 may be positioned closer to the printed circuit assembly 328 contributing to the distance 330 (or clearance) decreasing to a distance less than that of traditional fan assemblies.

Additional modifications may be made to the fan assembly 300 to reduce the overall height in the z-direction. For example, the motor hub 308 may include an outer peripheral portion 336 shown as imaginary lines representing a reduced height of motor hub 308 (in the z-direction). Despite the reduced height, it may be desirable to form the motor hub 308 reducing its material thickness. For example, a thickness 337 of the motor hub 308 may not be reduced when reducing the height 332 of the fan assembly 300. This is possible due in part by positioning the stator coils within the recessed portions (previously described) of the pillow 312, thereby allowing the motor hub 308 to occupy space previously occupied by the stator coils. The combination of the recessed portions, the location of the motor control circuit, and the position of the motor hub 308 in areas previously occupied by the stator coils, the distance 330 between the motor hub 308 and the printed circuit assembly 328 is minimized and the fan assembly 300 includes a height 332 in the z-direction that is lower than traditional fan motor assemblies.

Also, the fan assembly 300 may be adhesively secured with the pillow 312. This may be achieved by adhesively securing the bushing 316 with a first flange feature 342 and optionally a second flange feature 344 of the pillow 312. It should be understood that 1) the bushing 316 extends circumferentially around a longitudinal axis 362 extending through the center of the fan assembly 300, and 2) the first flange feature 342 extends circumferentially around the bushing 316. The second flange feature 344, when used, may be designed to receive (and in some cases, align) the stator coils, and may only extend around portions of the bushing 316. However, in other embodiments when the second flange feature 344 is not used, the pillow extends in a generally flat manner to the first flange feature 342. Further, the longitudinal axis 362 may be referred to as an axial direction to explain and described one or more axial interfaces, surfaces or regions. The bushing 316 may be designed to increase an axial interface region between the bushing 316 and the first flange feature 342 such that an axial length of an adhesive joint between the bushing 316 and the first flange feature 342 increases. For example, the second enlarged view 378 shows multiple axial interface regions between a channel 346 of the bushing 316 and surfaces of the first flange feature 342. As shown, the channel 346 generally surrounds the first flange feature 342 with the dimensions and tolerances of the channel 346 designed to improve alignment during assembly of the bushing 316. Traditional assembly may allow adhesive between only a single axial surface of the first flange feature 342 and the bushing 316, and may allow for limited adhesive bonding strength. However with the channel 346 defining a gap between two axial surfaces of the first flange feature 342, the channel 346 not only improves alignment between the bushing 316 and the pillow 312, but also allows an adhesive to flow around both axial surfaces of the first flange feature 342. In this manner, multiple adhesive interfaces are formed and the adhesive may form a stronger adhesive joint. Further, the channel 346 is designed as part of a radial gap (between the bushing 316 and the features of the pillow 312) to include a certain gap distance between the pillow 312 and the bushing 316 to ensure flow of an adhesive (not shown) between the two structures. Also, the bushing 316 includes a shoulder region 368 proximate to the second flange feature 344 with the radial gap extending between the shoulder region 368 and the second flange feature 344. This may allow for additional flow of the adhesive to increase an adhesive bond strength. This will be discussed in further detail below.

Figure 7:
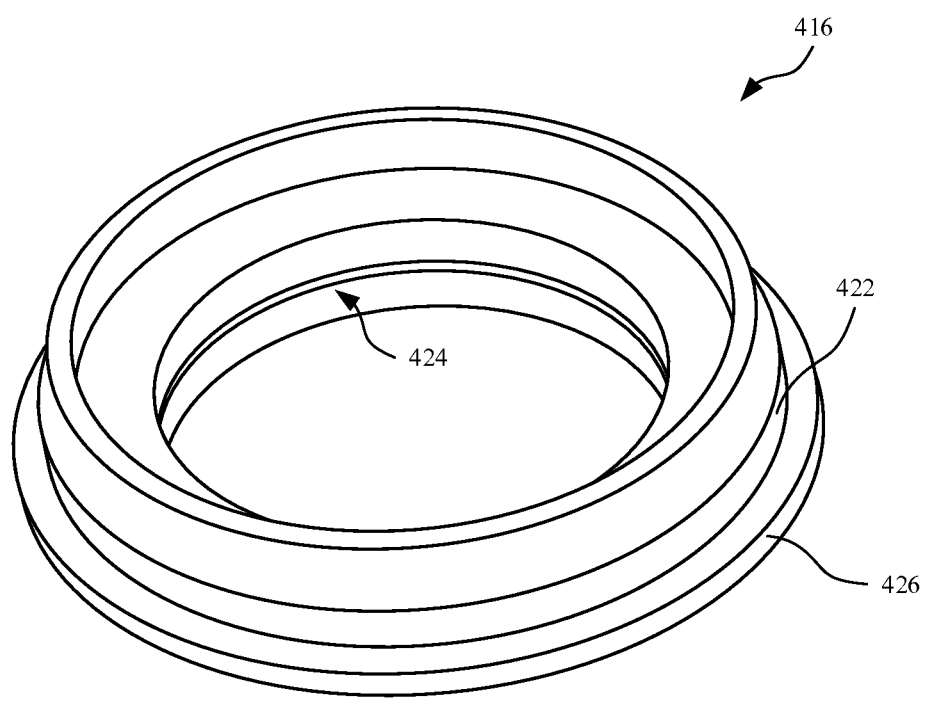
FIG. 7 illustrates an isometric top view of the bushing, in accordance with the described embodiments.
Figure 8:
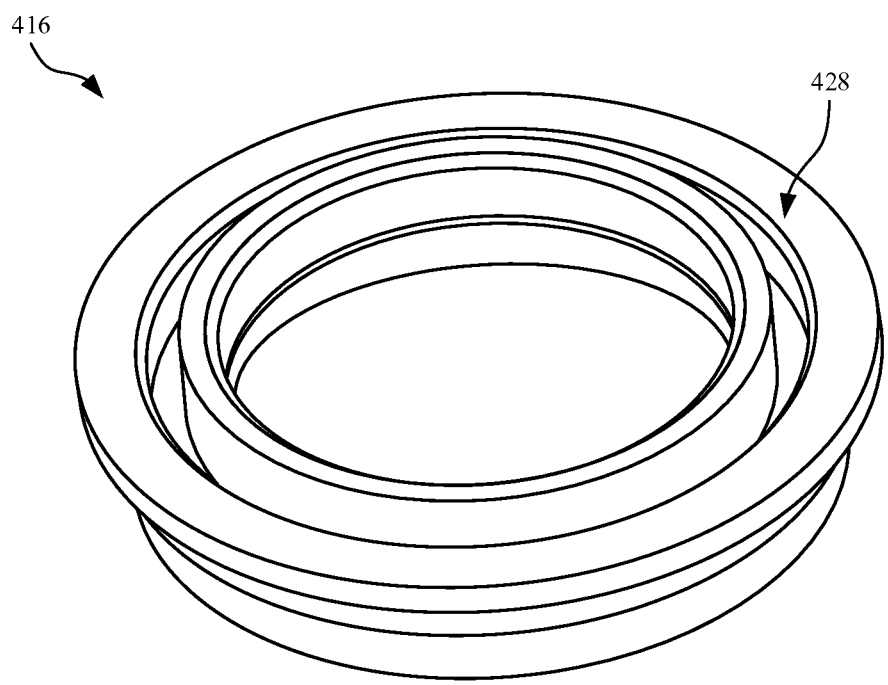
FIG. 8 illustrates an isometric bottom view of the bushing shown in FIG. 7.

FIGS. 7 and 8 illustrate isometric view of a bushing 416 in an isolated view, in accordance with the described embodiments. The bushing 416 shown and described may include any feature or features previously described for a bushing. FIG. 7 illustrates an isometric top view of the bushing 416. As shown, the bushing 416 includes an outer surface 422 designed to engage and align a stator (such as the stator 314, shown in FIG. 6). Also, an interior region of the bushing 316 further includes a bore region 424 defined by a space or void of any material. The bore region 424 is designed to receive a component of a fan assembly, such as a bearing. The bushing 416 also includes a shoulder portion 426 that may be designed to mate with a portion of a pillow (such as the first flange feature 342, shown in FIG. 6). For instance, the shoulder portion 426 may include a size and a shape to allow an adhesive to flow between the shoulder portion 426 and a flange feature of the pillow (such as the second flange feature 344 shown in FIG. 6) in order to form an adhesive joint. Further, the adhesive joint may include a thickness based upon the dimensions of the flange feature and/or shoulder portion 426 to ensure a bond line thickness of a chosen adhesive that allow the adhesive joint to include sufficient bonding strength.

FIG. 8 illustrates an isometric bottom view of the bushing 416. The bushing 416 includes a channel 428 designed to receive a flange feature (such as the first flange feature 342 shown in FIG. 6) as well as an adhesive. The channel 428 is further designed to define a part of a gap region to receive an adhesive in order to form an adhesive joint between the bushing 416 and another structural feature. The channel 428 may be formed by a material removal process that includes, for example, a lathe. However, the channel 428 may be formed during the formation of the bushing 416. For example, the channel 428 may be formed by injection molding, die casting, metal injection molding (MIM), all of which may include a mold cavity that include a shape designed to form the channel 428.

The relationship between a bushing and a pillow may be formed to optimize an adhesive joint designed to bond the bushing with the pillow. In particular, a radial gap extending between multiple interface regions of the bushing and features of the pillow may vary. For example, one portion of the radial gap may extend between a first bushing surface and a first pillow surface (or first flange feature surface) and may include a first gap thickness defined by the separation between the first bushing surface and the first pillow surface. Another portion of the radial gap may extend between a second bushing surface and a second pillow surface and may include a second gap thickness defined by the separation between the second bushing surface and the second pillow surface. The second gap thickness may be different (for example, greater than or less than) the first gap thickness. Also, the radial gap may include several axial channel components (defined as interface regions in the axial direction between the bushing and the pillow) as well as radial channel components (defined as interface regions in the radial direction between the bushing and the pillow, and generally perpendicular to the axial channel components).

To further describe the relationship, the gap distance between bushing-pillow surfaces may vary based upon a radial distance from a center of the bushing. Referring to the example above, the second bushing surface and the second pillow surface may be positioned further from the center of the bushing than the first bushing surface and the first pillow surface. In some embodiments, the gap distance varies in that the first gap distance is greater than the second gap distance.

Figure 9:
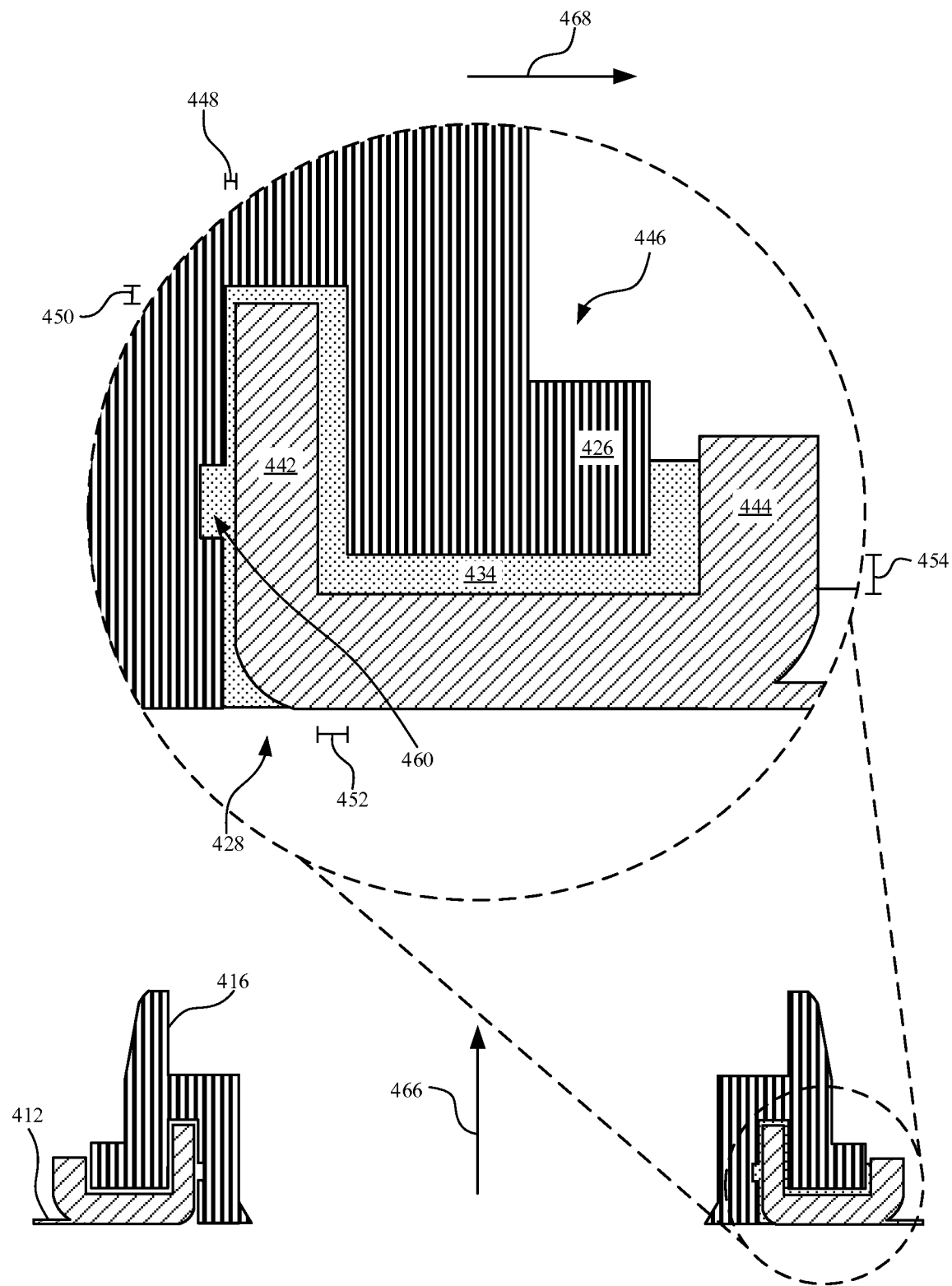
FIG. 9 illustrates a cross sectional view between the bushing (shown in FIGS. 7 and 8) and a pillow.

However, the gap distance varies in that the first gap distance is less than the second gap distance. For example, FIG. 9 illustrates a cross sectional view between the bushing 416 (shown in FIGS. 7 and 8) and a pillow 412. The pillow 412 may include several features previously described for a pillow. For example, as shown, the pillow 412 includes a first flange feature 442 and an optionally, may further include a floor feature 444. The enlarged view illustrates an adhesive 434 extending between the bushing 416 and the pillow 412. As shown, the adhesive 434 is in the channel 428 of the bushing extends around multiple axial surfaces of the first flange feature 442, with an "axial surface" defined by an axial direction denoted by the arrow 466. With the adhesive 434 surrounding the first flange feature 442 in a manner shown in FIG. 9, an adhesive joint formed by the adhesive 434 increases the bonding strength between the bushing 416 and the pillow 412.

Also, as shown in FIG. 9, the adhesive 434 extends along additional interface regions. For example, the adhesive 434 may extend to a location between the floor feature 444 and the shoulder portion 426 of the bushing 416. In this manner, the adhesive joint formed by the adhesive 434 secures additional features to increase the bond between the bushing 416 and the pillow 412. Accordingly, when the floor feature 444 is included, the floor feature 444 may act in a manner similar to an additional flange feature and define an additional axial connect point for an adhesive interface. Also, while a cross sectional view is shown, it should be understood that the flange features and the adhesive 434 extend in a generally circular or circumferential manner.

In addition to the adhesive 434 extending to multiple features, the adhesive 434 may vary in thickness according to the gap distances between the bushing-pillow surface interfaces. In particular, the variations in thickness may increase in a radially outward direction (denoted by an arrow 468) from a center of the bushing 416 to an exterior region of the bushing 416. For example, as shown in FIG. 9, the adhesive 434 includes a first thickness defined by a first gap distance 448 between the first flange feature 442 and the bushing 416. In particular, the first gap distance 448 may be a distance between a first surface of the channel 428 and a first surface of the first flange feature 442. The first gap distance 448 may be referred to as a distance between the bushing 416 and a first axial surface of the first flange feature 442 to define a first axial channel, with the axial direction defined by the arrow 466. Further, the adhesive 434 includes a second thickness defined by a second gap distance 450 between a second surface of the channel 428 and a second surface of the first flange feature 442, with the second gap distance 450 being greater than the first gap distance 448. The second gap distance 450 may be referred to as a distance between the bushing 416 and a first radial surface of the first flange feature 442 to define a first radial channel. Further, the adhesive 434 includes a third thickness defined by a third gap distance 452 between a third surface of the channel 428 and a third surface of the first flange feature 442, with the third gap distance 452 being greater than the second gap distance 450. The third gap distance 452 may be referred to as a distance between the bushing 416 and a second axial surface of the first flange feature 442 to define a second axial channel, with the axial direction defined by the arrow 466. Accordingly, a radial gap between the first flange feature 442 of the pillow and a channel 428 of the bushing 416 includes a graduated radial gap, that is, a gap that increases in a direction. As shown in FIG. 9, the direction is a radially outward direction. In addition to creating an alignment means between the bushing 416 with the pillow 412, the channel 428 allows the adhesive joint formed by the adhesive 434 to increase around multiple surfaces of the first flange feature 442, including multiple axial surfaces.

The adhesive joint formed by the adhesive 434 may extend and continue to increase in thickness in a radially outward direction. For example, as shown in FIG. 9, the adhesive 434 includes a fourth thickness defined by a fourth gap distance 454 between the bushing 416 and the pillow 412, with the fourth gap distance 454 being greater than the third gap distance 452. The fourth gap distance 454 may also be referred to as a gap between the shoulder portion 426 of the bushing 416 and a surface of a channel region 446 defined by the first flange feature 442 and the floor feature 444. The fourth gap distance 454 may be referred to as a distance between the bushing 416 and the channel region 446 between the first flange feature 442 and the floor feature 444, and defining a second radial channel. Accordingly, a radial gap between the bushing 416 and the pillow 412 may be graduated, or increased, in a radially outward direction from the first flange feature 442 to the floor feature 444. Also, when the radial gap is includes a desired graduated configuration (for example, as shown in FIG. 9), the circumferential groove 460 in the bushing 416 may be removed. In addition to the benefits of alignment between parts and additional adhesive interfaces, the graduated radial gap may provide additional benefits. For example, the adhesive 434, when disposed between the bushing 416 and the pillow 412, may undergo certain forces (such as capillary forces) that extract or purge air bubbles from the adhesive 434. In this manner, the adhesive density of the adhesive 434 increases and a stronger adhesive joint may be achieved.

While the embodiment shown in FIG. 9 described a bushing-pillow surface interface in which the gap distance increases in a radially outward direction, other embodiments may include different gap distance relationships. For example, in some embodiments, the gap distances decrease in the radially outward direction. Accordingly, in other embodiments, the first gap distance 448 shown in FIG. 9 is greater than the second gap distance 450, and the second gap distance 450 is greater than the third gap distance 452, and so on. Further, in some embodiments, a gap distance varies along a bushing-pillow surface interface. As an example, in some embodiments, the first gap distance 448 varies along an axial direction. In this manner, the first gap distance 448 may increase or decrease along the axial direction. This described variance may be representative of a variance along remaining bushing-pillow surface interfaces.

Figure 10:
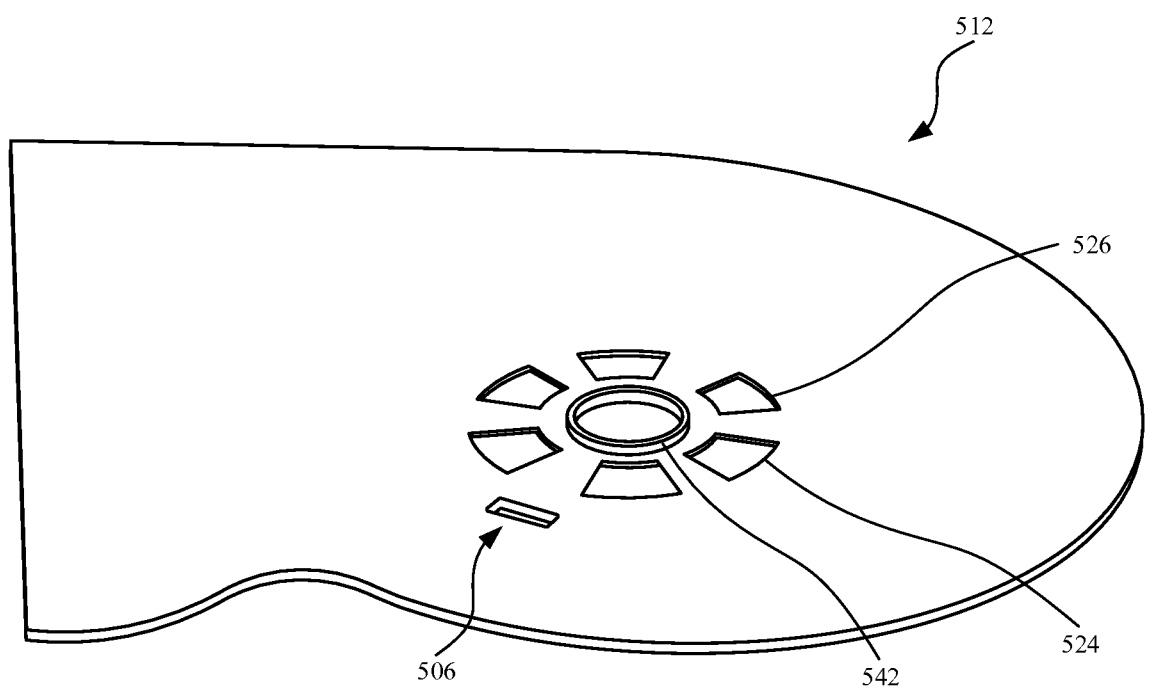
FIG. 10 illustrates an isometric view of an embodiment of a pillow designed to receive a fan assembly.

FIG. 10 illustrates an isometric view of the pillow 512, in accordance with the described embodiments, showing various features of the pillow 512. As shown, the pillow 512 includes an opening 506 and a flange feature 542. When the pillow 512 is formed from sheet metal, the flange feature 542 may be formed by, for example, a progressive die stamping operation. However, another metal bending operation may be performed to form the flange feature 542, such as deep drawing, MIM, die casting, machining (including a material removal process), or the like. Also, although not shown, the pillow 512 may include a second flange feature proximate to the flange feature 542. Also, while a discrete number of recessed portions, such as the first recessed portion 524 and the second recessed portion 526, are shown, the pillow 512 may include fewer or additional recessed portion based in part on the number of stator coils.

Figure 11:
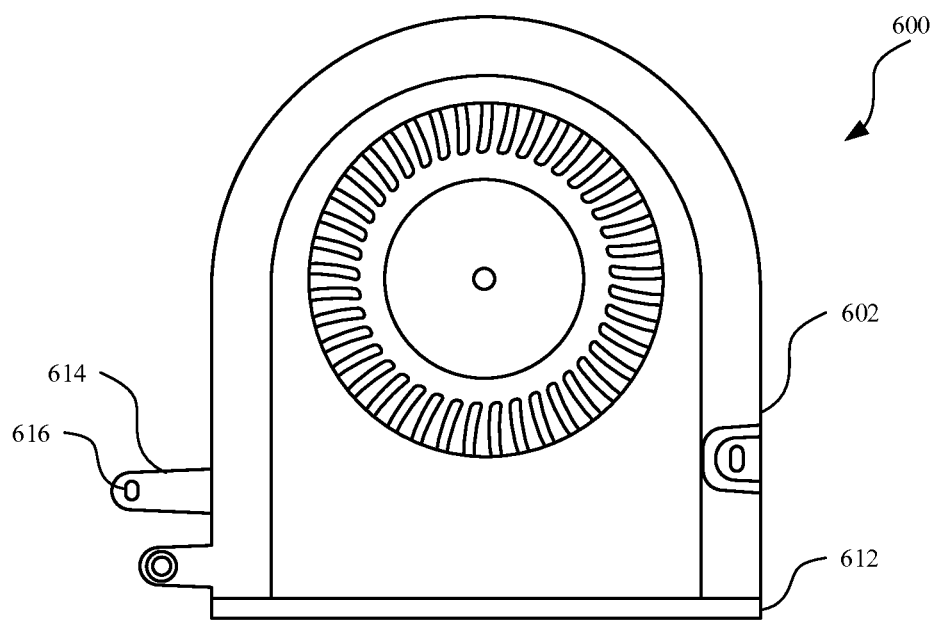
FIG. 11 illustrates a plan view of an alternate embodiment of a fan assembly, in accordance with the described embodiments.

The exterior features of a fan assembly may include additional enhancements. In particular, a pillow and a cover of a fan assembly may include certain mating features designed to improve assembly. For example, FIG. 11 illustrates a plan view of an alternate embodiment of a fan assembly 600, in accordance with the described embodiments. As shown, the fan assembly 600 includes a pillow 612 and a cover 602 disposed over the pillow 612. In embodiments when the cover 602 is metal, the cover 602 may be formed from any means previously described for a pillow. However, in other embodiments, the cover 602 is formed from a polymeric material, such as plastic. Also, the pillow 612 may include a flange feature 614 extending from the pillow 612. In some embodiments, the flange feature 614 is integrally formed with the pillow 612. The flange feature 614 includes an opening 616 designed to receive a fastener or other object used to secure the pillow 612 with an additional feature. Also, while a single flange feature is shown in FIG. 11, in other embodiments, the pillow 612 includes two or more flange features.

Figure 12:
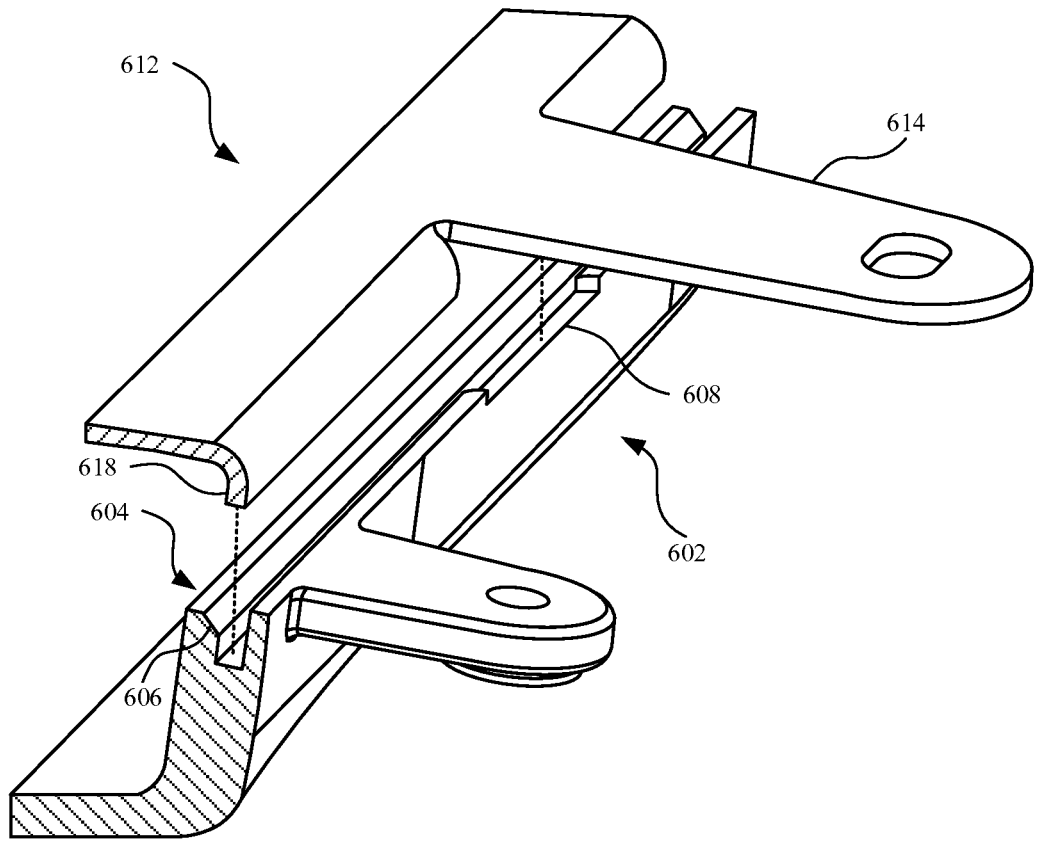
FIG. 12 illustrates a partial isometric view of the fan assembly show in FIG. 11 showing additional features of the pillow and the cover.

FIG. 12 illustrates a partial isometric view of the fan assembly show in FIG. 11 showing additional features of the pillow 612 and the cover 602. The cover 602 is separated from the pillow 612 to illustrate various features. For example, the cover 602 may include a channel 604 designed to receive a flange portion 618 of the pillow 612. The cover 602 may further include a chamfered region 606 designed to accommodate the curved profile of the flange portion 618 as shown in FIG. 12. Region 606 may also be a radius or other shape instead of the chamfer shape shown. Although only a partial view is shown, it should be understood that the channel 604 and the chamfered region 606 may extend along an outer perimeter of the cover 602 in manner similar to what is shown in FIG. 12. Also, the cover 602 may further include a second channel 608 designed to receive the flange feature 614. Also, the cover 602 may include additional channels similar to the second channel 608 to accommodate any additional flange features of the pillow 612.

Figure 13:
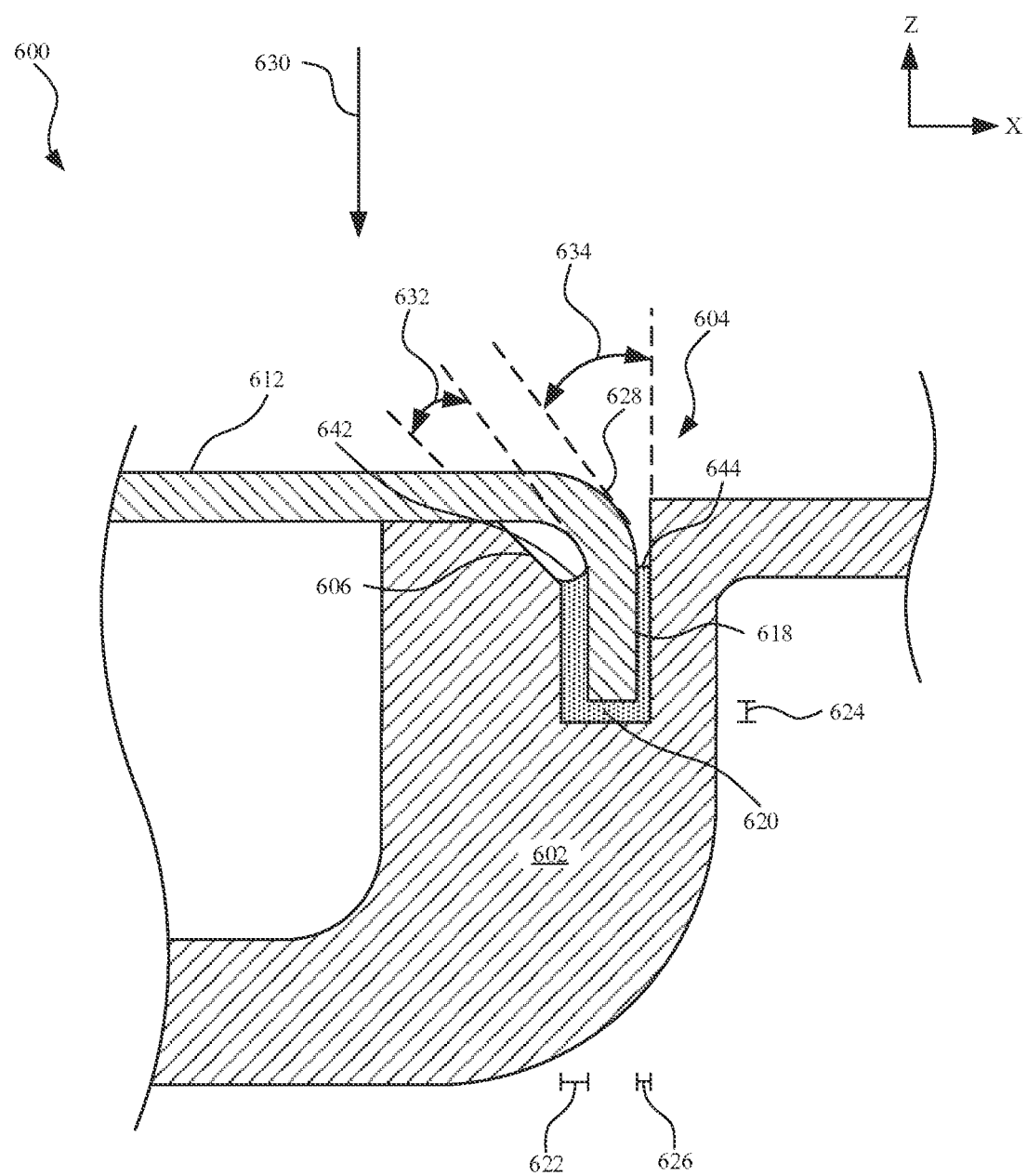
FIG. 13 illustrates a cross sectional view of the fan assembly shown in FIGS. 11 and 12, further showing the pillow adhesively secured with the cover.

When the flange portion 618 is positioned in the channel 604, an adhesive may flow in a remaining void or space in the channel 604. Further, the void or space may include optimal dimensions to enhance an adhesive joint formed by the adhesive. For example, FIG. 13 illustrates a cross sectional view of the fan assembly 600 shown in FIGS. 11 and 12, further showing the pillow 612 adhesively secured with the cover 602. As shown, an adhesive 620 is disposed in the channel 604 of the cover 602 and extends around the flange portion 618 of the pillow 612. The adhesive joint formed by the adhesive 620 may exhibit several similar properties previously described for an adhesive joint used to adhesively secure a bushing with a pillow. For example, as shown in FIG. 13, the adhesive 620 extends along multiple axial surfaces of the flange portion 618, with an axial direction denoted by an arrow 630. Further, the adhesive 620 may include a first thickness defined by a first gap thickness 622 between a first axial surface of the flange portion 618 and a first surface of the channel 604. The first gap thickness 622 may be a smaller thickness to assist in aligning the cover 602 with the pillow. Further, the adhesive 620 may include a second thickness defined by a second gap thickness 624 between a radial surface of the flange portion 618 and a second surface of the channel 604, with the second gap thickness 624 being less than the first gap thickness 622. Also, the adhesive 620 may include a third thickness defined by a third gap thickness 626 between a second axial surface of the flange portion 618 and a second surface of the channel 604, with the third gap thickness 626 being less than the second gap thickness 624. Accordingly, the adhesive 620, based upon the gap thicknesses, includes a thickness (between surfaces) that may continually increases in a direction. Further, the second gap thickness 624 may be adjusted in accordance with the selected adhesive to ensure sufficient bond strength. Accordingly, the adhesive 620 may include a graduated, or increasing thickness. While FIG. 13 illustrates a side view, it should be understood that the various features of the pillow 612, such as the flange portion 618, extend around the pillow 612 in location other than a flange feature (similar to the flange feature 614, shown in FIG. 12). Also, the channel 604 may extend around the cover 602 in location corresponding to the flange portion 618. Also, although not shown, the gap thicknesses may increase in the opposite direction such that the first gap thickness 622 is less than the second gap thickness 624, which in turn, is less than the third gap thickness 626. Accordingly, in this described embodiment, the adhesive 620, based upon the gap thicknesses, includes a thickness that may continually increases in the opposite direction as that shown in FIG. 13.

Also, the gap thicknesses may include a size and a shape to create a desired effect with the adhesive 620. For example, the space or void defined by the third gap distance 626, coupled with the space or void between the channel 604 and curved region 628 of the flange portion 618 (or curved region 628 of the pillow 612), may combine to control an adhesive meniscus position to provide cosmetic consistency to the fan assembly 600. As shown in FIG. 13, the fan assembly 600 may include a first clearance 632 defined in part by a first divergence rate between the first axial surface of the channel 604 (which may include the chamfered region 606) and an inner surface of the curved region 628 of the pillow 612. The first clearance 632 may control certain dimensions (such as a size and a shape) of a first meniscus 642 formed form the adhesive 620 during a liquid (pre-cured) state of the adhesive 620 during assembly. In addition, the fan assembly 600 may include a second clearance 634 defined in part by a second divergence between the second axial surface of the channel 604 and an inner outer the curved region 628 of the pillow 612. The second clearance 634 may control certain dimensions (such as a size and a shape) of a second meniscus 644 formed form the adhesive 620 during a liquid (pre-cured) state of the adhesive 620 during assembly. In some embodiments, the first clearance 632 (and, in turn, the first divergence rate) is similar to the second clearance 634 (and, in turn, the second divergence rate). In other embodiments, the first clearance 632 is different than the second clearance 634. In either event, both the first divergence rate and the second divergence rate can be adjusted by adjusting the first clearance 632 and the second clearance 634, respectively. Adjusting manufacturing parameters of the pillow 612 and/or the cover 602 can in turn adjust the first divergence and the second divergence. By adjusting the first divergence, the first meniscus 642 may be raised or lowered to a desired height in, for example, a z-dimension. Also, by adjusting the second divergence, the second meniscus 644 may be raised or lowered to a desired height in, for example, a z-dimension. Accordingly, by adjusting the menisci, the height of the adhesive 620 in the z-dimension can be controlled to a desired height.

Figure 14:
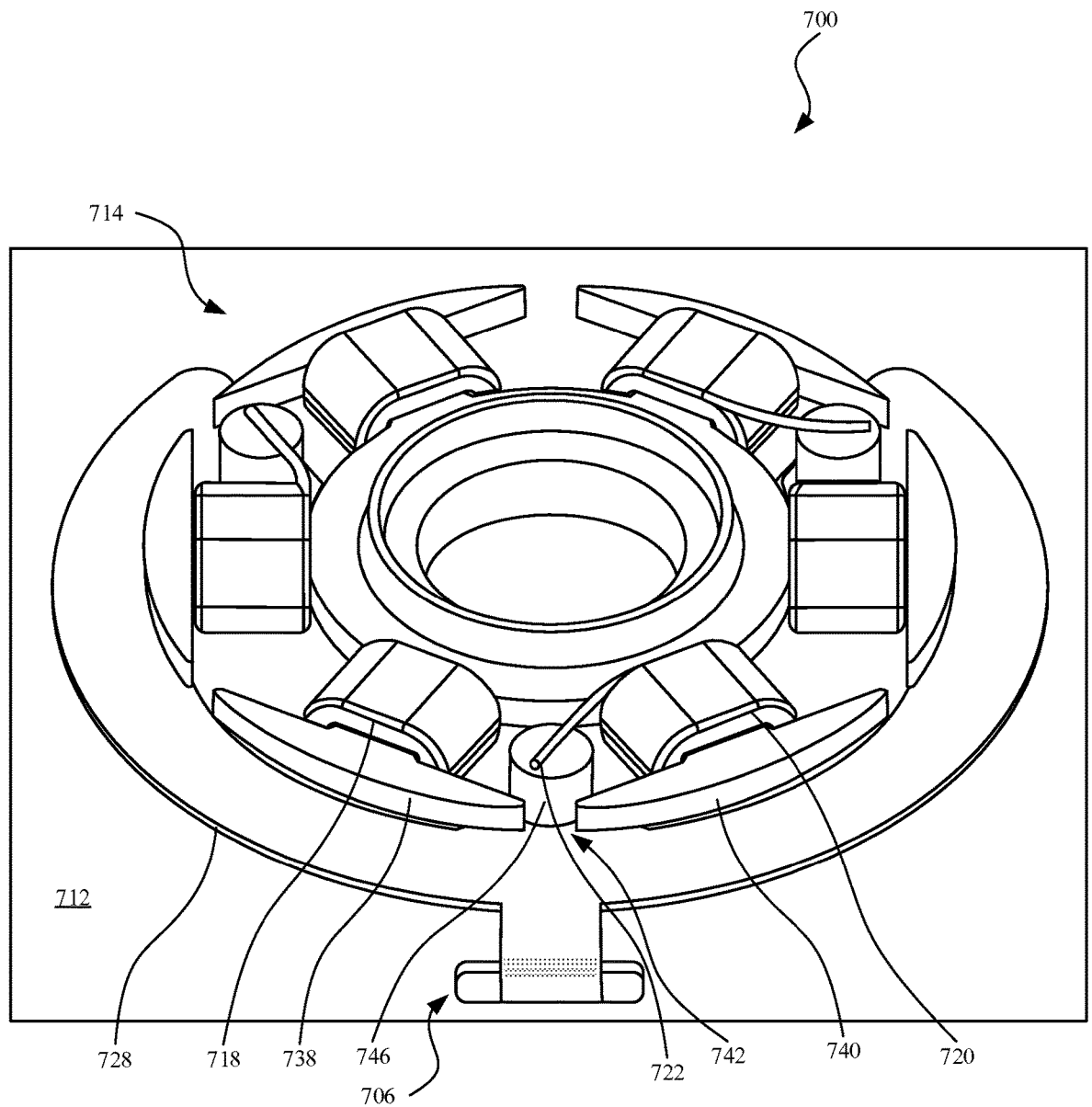
FIG. 14 illustrates an isometric view of an embodiment of a stator having coils with wires electrically connected with protrusions attached to a flexible printed circuit assembly.

FIG. 14 illustrates an isometric view of an embodiment of a fan assembly 700 that includes a stator 714 disposed on a pillow 712. The motor hub is removed for purposes of illustration. The stator 714 may include several stator poles, each of which including stator coils having electrically conductive wires wound about the stator poles. For example, a first stator coil 718 and a second stator coil 720 (adjacent to the first stator coil 718) include electrically conductive wires wound around a first stator pole 738 and a second stator pole 740 (adjacent to the first stator pole 738), respectively. For purposes of clarity, the wire portions interconnecting the stator coils are not shown. Also, the pillow 712 includes an opening 706 allowing a printed circuit assembly 728 to pass through pillow 712 and electrically connect to another component (for example, a motor control circuit 319, in FIG. 4). In some embodiments, the printed circuit assembly 728 is a printed circuit board. In the embodiment shown in FIG. 14, the printed circuit assembly 728 is a flexible printed circuit assembly.

One solution to positioning a terminating wire in a location other than between a magnet and a printed circuit assembly is to form several posts on the printed circuit assembly. For example, FIG. 14 further illustrates the printed circuit assembly 728 having several posts connected (electrically and mechanically) with the printed circuit assembly 728. The posts may be positioned between at least some of stator coils. For example, a first post 742 (representative of the remaining posts) is positioned between the first stator coil 718 and the second stator coil 720 adjacent to the first stator coil 718. As shown, the first post 742 is designed to receive a wire portion 722 from the second stator coil 720, with the wire portion 722 electrically connected with the first post 742. In this configuration, the stator coils may include a wire (of a stator coil), which not only forms an electrical connection with the printed circuit assembly 728 in a location between stator coils, but also in a location other than between the printed circuit assembly 728 and a motor hub when the motor hub is installed. This allows for a clearance free of connections between the motor hub and the printed circuit assembly 728 and a height of the fan assembly 700 may be reduced.

Each post may also be referred to as a boss. Also, each post may be mounted onto the printed circuit assembly 728 by, for example, surface mount technology ("SMT"). Surface mount technology may include an assembly process in which a circuit board (for example, a printed circuit assembly 728) passes through a "pick-and-place" machine designed to assemble the posts (such as the first post 742) onto the circuit board. Also, in some embodiments, the posts are formed from copper. In other embodiments, the posts formed from brass. Generally, posts may be formed from any electrically conductive material (or materials) known in the art that may electrically connect with the printed circuit assembly 728. As such, the posts may facilitate electrical conduction from the wires of stator coils to the printed circuit assembly 728, or vice versa. In any case, the posts may include a metallic plating formed from a material such as tin in order to facilitate the solderability needed for the wire connection (such as the wire portion 722) to a first end of a post and the SMT reflow process used to attach a second end of the post to the printed circuit board. Also, in some embodiments, the posts may include an insulated, non-electrically conductive material on an exterior portion (e.g., curved lateral surface) in order to prevent electrical shorting to adjacent stator coils such as the first stator coil 718 or the second stator coil 720. For example, an exterior portion 746 of the first post 742 is shown in FIG. 14. Also, although not shown, each post in FIG. 14 may include a pre-applied solder material designed to facilitate an electrically connection between the wire portions and the posts.

The connection means for connection of a wire portion on the posts may include conductive adhesive, soldering or other methods for achieving electrical connection. Also, as shown in FIG. 14, the posts may be elevated in order to facilitate the manufacturing process. For example, the first post 742 is elevated relative to the first stator coil 718 and the second stator coil 720, allowing for tools, such as a soldering tool, to access the first post 742 without contacting the first stator coil 718 and/or the second stator coil 720, thereby decreasing the likelihood of damage during manufacturing and increasing the likelihood of improved manufacturing times and throughput. Also, the posts may be positioned between adjacent stator coils and may be centered between the adjacent stator coils. By positioning posts between at least some of the stator coils, the fan assembly 700 uses space previously unoccupied. In this manner, the fan assembly 700 can reduce its height in a dimension (such as a z-dimension) to reduce the overall height of the fan assembly 700, and in turn, reduce an overall height of an electronic device that includes the fan assembly 700.

Figure 15:
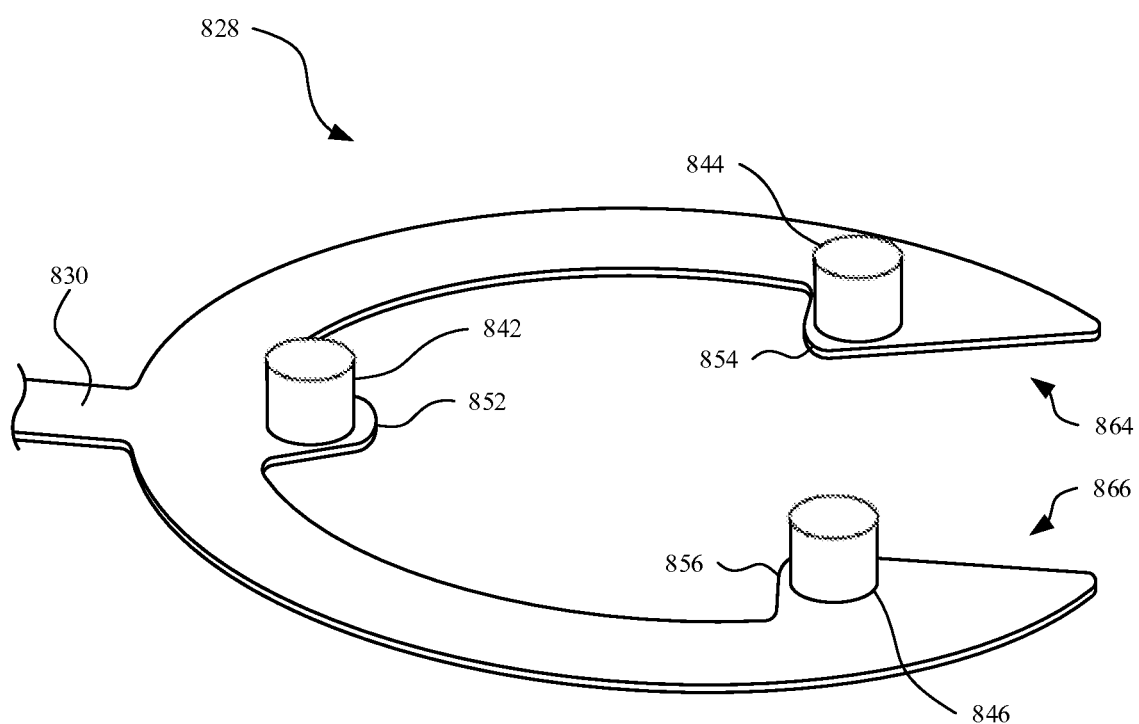
FIG. 15 illustrates an isometric view of an embodiment of a printed circuit assembly having posts as well as an elongated portion designed to electrically connect with another component.

FIG. 15 illustrates an isometric view of an embodiment of a printed circuit assembly 828 having several posts as well as an elongated portion 830 designed to electrically connect with another component. The printed circuit assembly 828 may be used with a fan assembly previously described. However, several components (such as a stator and stator coils) are removed for purposes of illustration. In this regard, the elongated portion 830 may be fitted with a connector (not shown) that terminates one or more electrical connections of the printed circuit assembly 828 such that the connector may electrically couple with another component. Further, the elongated portion 830 may extend through an opening (such as the opening 506 shown in FIG. 10) and the printed circuit assembly 828 may be disposed on a pillow (such as the pillow 512 shown in FIG. 10).

In some embodiments, the printed circuit assembly 828 is a flexible printed circuit assembly. As shown, the printed circuit assembly 828 includes a first post 842, a second post 844, and a third post 846. While the embodiment of the printed circuit assembly 828 shows three posts, any number of posts necessary to connect stator coil wires in a desired manner may be used. For example, a 3-phase DC motor may require three posts, as shown. However, other motors may include more or less posts. Also, the printed circuit assembly 828 also includes extension in locations proximate to the posts. For example, the printed circuit assembly 828 includes a first extension 852 proximate to first post 842. In this manner, the first post 842, which includes electrically conductive portions, does not contact any surface below the printed circuit assembly 828 (for example, a pillow) thereby preventing, or at least reducing, the probability of an electrical short. Also, as shown the printed circuit assembly includes a second extension 854 and a third extension 856 to accommodate the second post 844 and the third post 846, respectively.

Also, in some embodiments, the printed circuit assembly 828 is a ring, annulus, or other shape designed to accommodate various components of a fan assembly. In the embodiment shown in FIG. 15, the printed circuit assembly 828 is a U-shaped arc that includes a first edge 864 and a second edge 866. The first edge 864 and/or the second edge 866 may be shaped to conform to other structures positioned on, or proximate to, a pillow (or other substrate). For example, as shown FIG. 15, the first edge 864 and the second edge 866 combine to generally define a V-shaped configuration, which may assist in aligning the printed circuit assembly 828, and in turn, with a component having corresponding shape.

Figure 16:
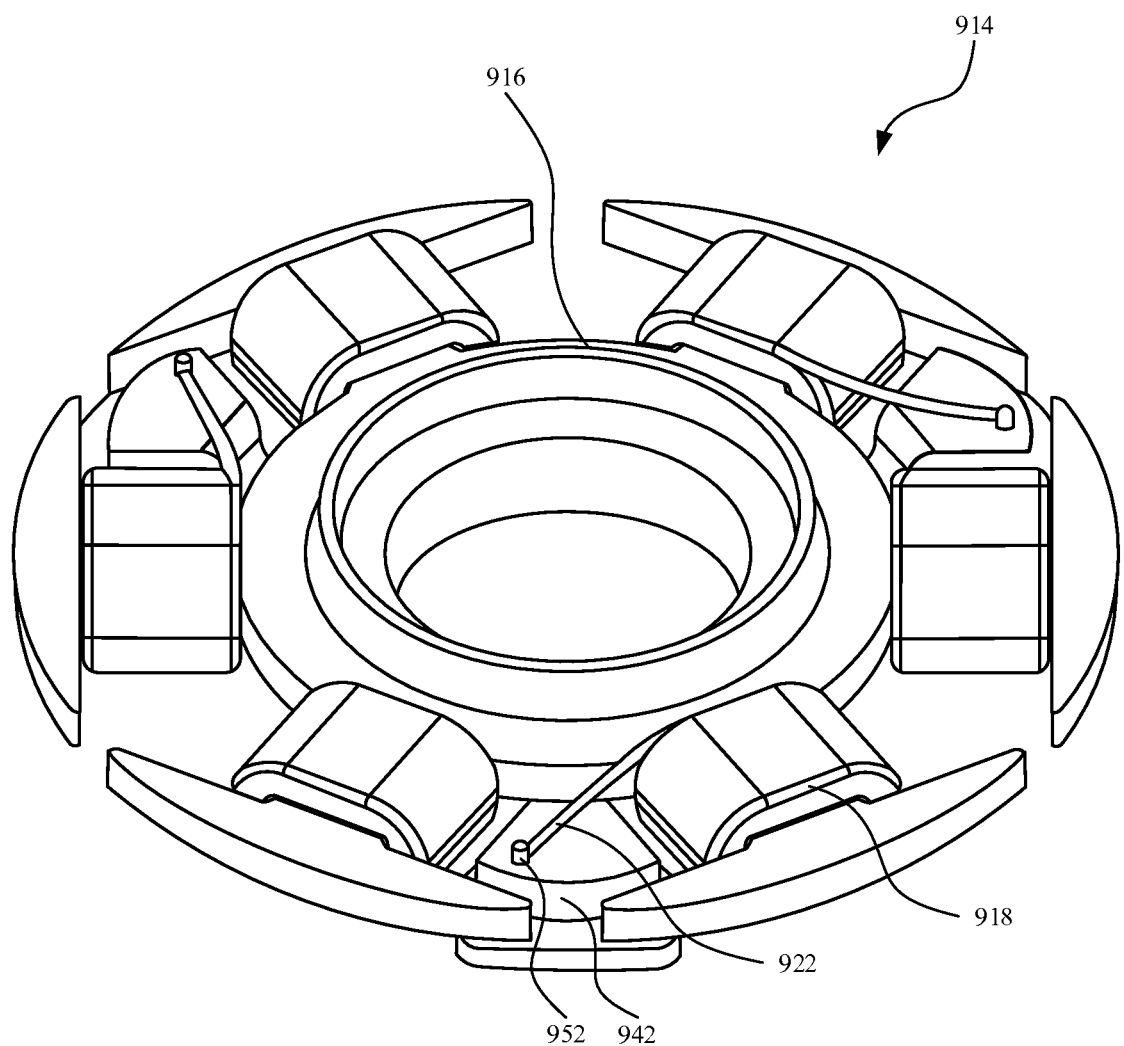
FIG. 16 illustrates an isometric view of an embodiment of a stator surrounding a bushing, in accordance with the described embodiments.

The bushing may include additional features designed to facilitate connection of wires of a stator coil during an assembly operation of a fan assembly. For example, FIG. 16 illustrates an isometric view of an embodiment of a stator 914 surrounding a bushing 916, in accordance with the described embodiments. In some embodiments, the bushing 916 is formed from a non-electrically conductive material (or materials) capable of withstanding heat in order to facilitate certain operations, such as soldering. The bushing 916 may include several protruding features having pins formed from an electrically conductive material (or materials), with the pins designed to receive a wire from a wire portion of the stator coils. For example, as shown in FIG. 16, the bushing 916 includes a first protruding feature 942 integrally formed with the bushing 916. In other words, the bushing 916 and the first protruding feature 942 are formed as a single, continuous body from the same material or materials. This may be performed by, for example, an injection molding or a compression molding operation having a mold cavity with a size and a shape of the bushing 916 and one or more protruding features. Accordingly, the first protruding feature 942 is formed from a non-electrically conductive material (or materials). As shown, the first protruding feature 942 includes a first pin 952 designed to receive a wire portion 922 from the first stator coil 918. In some embodiments, the bushing 916 is formed from a relatively less rigid material such that the first protruding feature 942 is flexible with respect to the stator 914. Also, the first stator coil 918, the first protruding feature 942, and the first pin 952 may be representative of the remaining stator coils, protruding features, and pins, respectively.

In some embodiments, the first pin 952 is an electrically conductive feature that extends beyond the first protruding feature 942, allowing the wire portion 922 to be electrically connect with, for example, a solder material. In the embodiment shown in FIG. 16, the first pin 952 is a pogo-pin having spring-loaded pins designed to receive the wire portion 922. Also, the first pin 952 extends from a top portion of the first protruding feature 942 and further extending from a bottom portion (not shown) of the first protruding feature 942. In this manner, the first pin 952 may electrically connect the first stator coil 918 with a printed circuit assembly (not shown). Also, the first pin 952 may be electrically connected to another component at the bottom portion (discussed below). Similar to the posts shown in FIG. 15, the protruding features shown in FIG. 16 are positioned between at least some of the stator coils.

Figure 17:
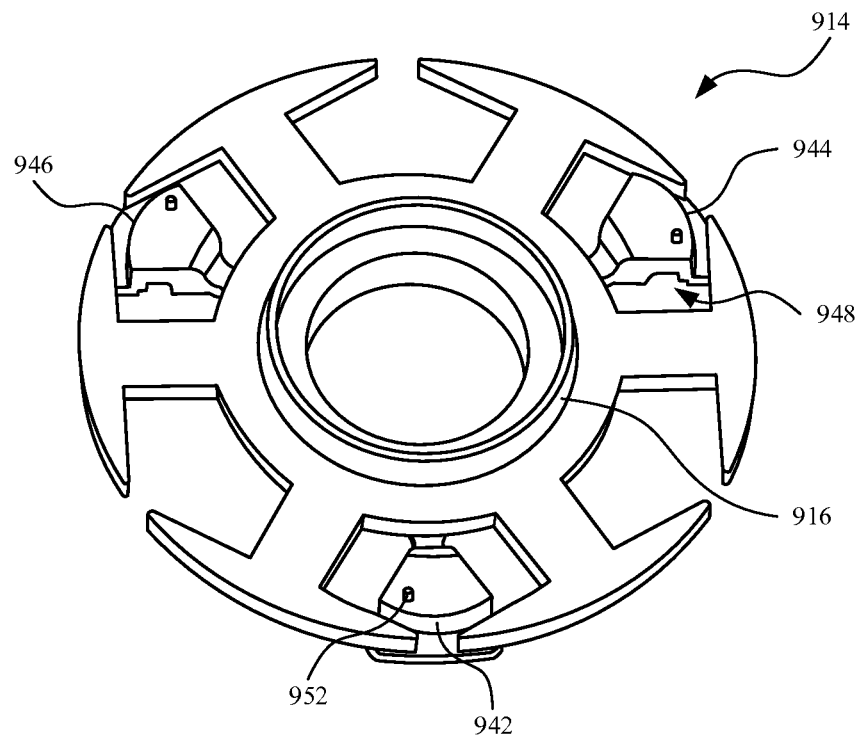
FIG. 17 illustrates a top view of an embodiment of a stator bushing having connections points for wire termination.
Figure 18:
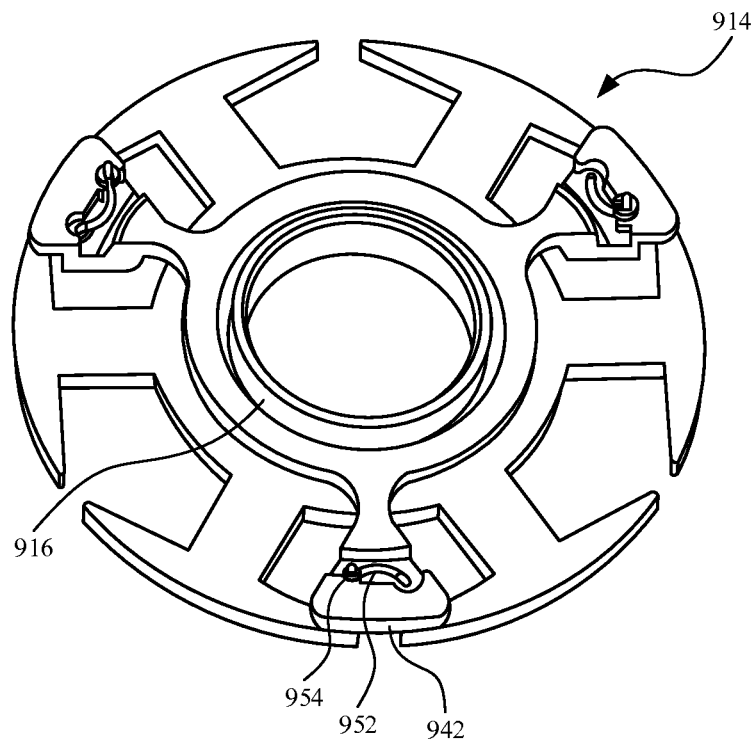
FIG. 18 illustrates a bottom view of the stator bushing shown in FIG. 17, in accordance with the described embodiments.

FIGS. 17 and 18 illustrate top and bottom views, respectively, of the stator 914 and bushing 916, both of which are shown in FIG. 16. However, the stator coils in FIG. 16 are removed for purposes of illustration and clarity. FIG. 16 illustrates the bushing 916 having a first protruding feature 942, a second protruding feature 944, and third protruding feature 946, each of which are centered between adjacent stator poles. The stator coils wound around the stator poles are removed for purposes of clarity and illustration. Also, the first pin 952 of the first protruding feature 942 is designed to be elevated with respect to the stator coils (not shown) in order to facilitate a wire connection operation between the first pin 952 and a wire portion of a stator coil. It will be appreciated that the first pin 952 is representative of the remaining pins. Also, protruding features of the bushing 916 may include one or more channel features that provide functional enhancements similar to those of the channel 428 (shown in FIG. 8). For example, as shown in FIG. 17, the second protruding feature 944 includes a channel 948. The channel 948 may be designed to receive a flange feature (not shown) as well as an adhesive to adhesively secure the bushing 916 with the flange feature. Also, the channel 948 may be designed to form a gap region with graduated gap distances in a manner previously described.

FIG. 18 illustrates a bottom view of the bushing 916, showing the pins of the protruding features having an arch-shaped, cantilevered bend. The cantilevered bend as well as the flexibility of the protruding features act as a spring to create the "pogo action" of the pogo pin, in those embodiments in which the pins are pogo pins. For example, the first pin 952 is designed to provide a preloading force to ensure electrical contact to a pad (not shown) on a surface or region of another component (for example, a circuit board or a connector of the keyboard 212 shown in FIG. 3) adjacent to the fan of an electronic device 200 (shown in FIG. 3). The pins may also include a connector integrated with the bushing 916. For example, the first protruding feature 942 includes a first connector 954 formed with the bushing 916. The first connector 954 is designed to receive the first pin 952, and may be representative of the remaining connectors shown in FIG. 18. Also, the pins extending from the bottom portion of bushing 916 indicate a location in which the pins may exit a pillow of a fan assembly in order to make an electrical connection with a contact pad (or pads) located externally with respect to the fan assembly. This allows the stator coils having wires connected with the pins to be electrically connected to another component or components, such as a motor control circuit 319 (shown in FIG. 3). Also, in this manner, the stator coils need not be electrically connected to a component via a printed circuit assembly (such as the printed circuit assembly 828, shown in FIG. 16). Further, the bushing 916 may be formed from a non-electrically conductive material (or materials). In this manner, the protruding features may form electrically insulating features for at least a portion of their respective pins.

Figure 19:
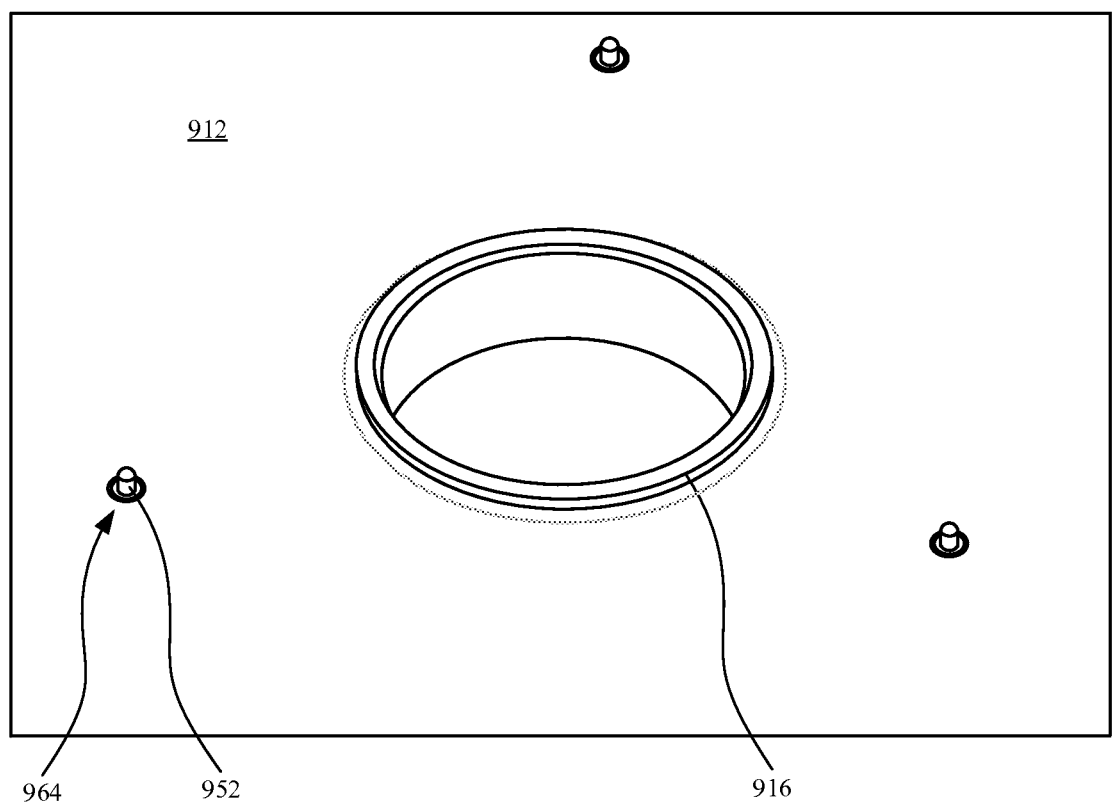
FIG. 19 illustrates an isometric view of a stator and stator bushing assembled with a pillow of an electronic device, in accordance with the described embodiments.

To further illustrate, FIG. 19 illustrates a bottom view of pillow 912 (or base) engaged with the bushing 916, with the pillow 912 having openings allowing the pins of a bushing 916 to extend through the pillow 912 in order to electrically connect the stator coils (not shown) with a component, such as a contact pad or another printed circuit assembly. As shown, the first pin 952 (disposed in the first protruding feature 942, shown in FIG. 18) extends through a first opening 964 of the pillow 912. When the bushing 916 and the protruding feature are formed from non-electrically conductive materials, the bushing 916 and the protruding feature define an insulating sleeve around the first pin 952 to avoid electrical shorting to the pillow 912 when an electrical current flows through the first pin 952. It will be appreciated that the first pin 952 and its features are representative of the remaining pins.

Although several means or locations for wire terminations are disclosed, other means may be available. For example, in some embodiments, individual male or female connectors are located between the stator coils, and the electrical connection of the fan assembly can be made through terminals of these connectors.

Figure 20:
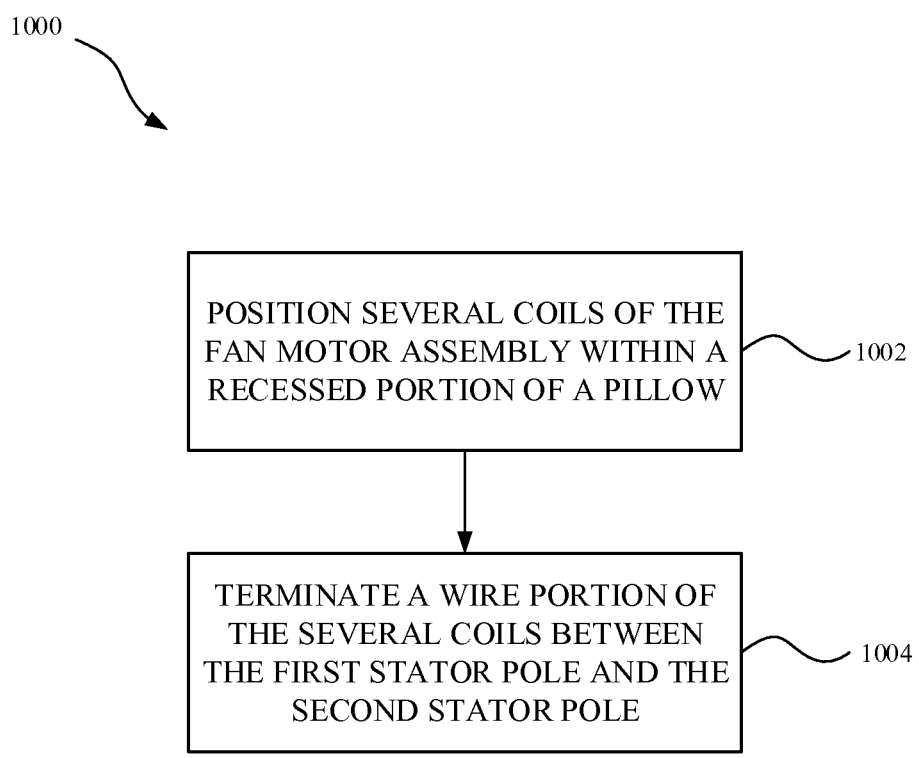
FIG. 20 illustrates a flowchart showing a method for reducing a dimension of a motor.

FIG. 20 illustrates a flowchart 1000 showing method for reducing a dimension of a motor of a fan assembly of an electronic device. In step 1002, several coils of the fan assembly are positioned within a recessed portion of a pillow. In some embodiments, the coils are stator coils of the fan assembly. In some embodiments, the coils include a first stator coil and a second stator coil, with first stator coil having a wire portion capable of electrically connecting with a circuit assembly in a location between the first stator coil and the second stator coil. For example, a bushing may include several protruding features, each of which may include a pin or other feature. Alternatively, a circuit assembly may include several protrusions, each of which is designed to receive a wire portion of the first stator coil and/or the second stator coil.

In step 1004, the wire is terminated on a protrusion positioned between the first stator coil and the second stator coil. In some embodiments, the first stator coil is electrically connected to a motor control circuit via the protrusion and a printed circuit. In some embodiments, the protrusion is centered between adjacent stator coils. In some embodiments, the protrusion is electrically conductive. In other embodiments, the protrusion is an assembly including a non-electrically conductive portion (e.g., nonconductive sleeve positioned on outer surface of the protrusion) that is part of a non-electrically conductive stator bushing and an electrically connecting portion. In this embodiment, the protrusion (or protrusions) may include a pin configured to receive and terminate the wire of the stator coil.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A fan assembly, comprising:
a bushing characterized by an inner annular wall and an outer annular wall and including a channel defined between the inner annular wall and the outer annular wall, wherein the channel is characterized by an inner annular radius and an outer annular radius; and
a pillow extending radially outward from a central axis through the fan assembly, the pillow having a first flange extending from a base of the pillow in a direction parallel to the central axis and into the channel of the bushing, wherein the pillow comprises a second flange radially outward of the first flange from the central axis and extending parallel to the central axis of the fan assembly in the same direction as the first flange, wherein the first flange is characterized by an inner radial surface proximal the central axis through the fan assembly and separated from the inner annular radius of the channel defined by the bushing by a first gap distance, wherein the first flange is characterized by an outer radial surface distal the central axis through the fan assembly and separated from the outer annular radius of the channel defined by the bushing by a second gap distance different from the first gap distance, wherein the channel is further defined by a surface of the bushing extending perpendicular to the central axis of the fan assembly, wherein the first flange includes a surface parallel to the surface of the bushing extending perpendicular to the central axis of the fan assembly, and wherein the surface of the first flange is separated from the surface of the bushing extending perpendicular to the central axis of the fan assembly by a distance greater than the first gap distance.

2. The fan assembly of claim 1, wherein the second gap distance is greater than the first gap distance.

3. The fan assembly of claim 2, further comprising an adhesive joint comprising an adhesive disposed in the channel, the adhesive including a first thickness corresponding to the first gap distance and a second thickness corresponding to the second gap distance.

4. The fan assembly of claim 1, wherein the bushing further comprises a shoulder portion, and wherein an inner radius of the shoulder portion at least partially defines an outer radial wall of the channel.

5. The fan assembly of claim 4, wherein the shoulder portion extends between the first flange and the second flange.

6. The fan assembly of claim 5, wherein the shoulder portion is recessed within a space defined between the first flange and the second flange.

7. The fan assembly of claim 6, further comprising an adhesive disposed within the space defined between the first flange and the second flange, wherein the adhesive extends a first thickness between the first flange and the shoulder portion, wherein the adhesive extends a second thickness between the shoulder portion and the second flange, and wherein the second thickness is greater than the first thickness.

8. The fan assembly of claim 1, further comprising a stator coil.

9. The fan assembly of claim 8, wherein the pillow defines a recess configured to at least partially receive the stator coil.

10. The fan assembly of claim 9, wherein the recess is located radially outward of the second flange.

11. The fan assembly of claim 8, further comprising a plurality of stator coils, the pillow defining a plurality of recesses individually located to receive a corresponding stator coil.

12. The fan assembly of claim 1, further comprising a stator pole, wherein the first flange of the pillow extends vertically towards the stator pole.

13. The fan assembly of claim 1, wherein the first flange is characterized by a first vertical height, and wherein the second flange is characterized by a second vertical height less than the first vertical height.

* * * * *